(12) United States Patent
Go et al.

(10) Patent No.: US 9,490,140 B2
(45) Date of Patent: Nov. 8, 2016

(54) METHOD FOR MANUFACTURING SEMICONDUCTOR DEVICE

(71) Applicants: Hyun Yong Go, Suwon-si (KR); Eun Young Lee, Suwon-si (KR); Jung Geun Jee, Seoul (KR); Eun Yeoung Choi, Seoul (KR); Jin Gyun Kim, Suwon-si (KR); Hun Hyeong Lim, Hwaseong-si (KR)

(72) Inventors: Hyun Yong Go, Suwon-si (KR); Eun Young Lee, Suwon-si (KR); Jung Geun Jee, Seoul (KR); Eun Yeoung Choi, Seoul (KR); Jin Gyun Kim, Suwon-si (KR); Hun Hyeong Lim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/833,311

(22) Filed: Aug. 24, 2015

(65) Prior Publication Data

US 2016/0064227 A1 Mar. 3, 2016

(30) Foreign Application Priority Data

Aug. 26, 2014 (KR) ........................ 10-2014-0111858

(51) Int. Cl.
*H01L 21/3205* (2006.01)
*H01L 21/321* (2006.01)
*H01L 29/49* (2006.01)
*H01L 27/115* (2006.01)

(52) U.S. Cl.
CPC ....... *H01L 21/321* (2013.01); *H01L 27/11524* (2013.01); *H01L 27/11556* (2013.01); *H01L 27/11582* (2013.01); *H01L 29/495* (2013.01)

(58) Field of Classification Search
CPC .......... H01L 21/321; H01L 27/11582; H01L 27/11556; H01L 27/11524; H01L 29/495
USPC .......................................................... 438/585
See application file for complete search history.

(56) References Cited

U.S. PATENT DOCUMENTS

| | | | |
|---|---|---|---|
| 5,989,988 A | 11/1999 | Iinuma et al. | |
| 7,371,669 B2 | 5/2008 | Youn et al. | |
| 2006/0110900 A1* | 5/2006 | Youn ................ | H01L 21/28044 438/592 |
| 2006/0175291 A1* | 8/2006 | Hunt ..................... | B08B 7/0035 216/67 |
| 2006/0205159 A1 | 9/2006 | Park | |
| 2011/0049646 A1* | 3/2011 | Lim .................. | H01L 21/28556 257/410 |
| 2012/0217513 A1 | 8/2012 | Tega et al. | |
| 2015/0200089 A1* | 7/2015 | Suen ................ | H01L 21/28079 438/592 |
| 2015/0235836 A1 | 8/2015 | Go et al. | |

FOREIGN PATENT DOCUMENTS

| | | |
|---|---|---|
| JP | 2001-044387 | 2/2001 |
| JP | 2010-093170 | 4/2010 |
| KR | 100273286 | 9/2000 |
| KR | 1020010008618 | 2/2001 |
| KR | 1020060037821 | 5/2006 |
| KR | 20150098309 | 8/2015 |

* cited by examiner

*Primary Examiner* — Trung Q Dang
(74) *Attorney, Agent, or Firm* — Myers Bigel, P.A.

(57) ABSTRACT

There are provided methods for manufacturing a semiconductor device including providing a substrate including a metal layer including an oxidized surface layer in a heat treatment chamber, generating hydrogen radicals within the heat treatment chamber and reducing the oxidized surface layer of the metal layer using the hydrogen radicals.

20 Claims, 23 Drawing Sheets

METHOD FOR MANUFACTURING SEMICONDUCTOR DEVICE

CROSS-REFERENCE TO RELATED APPLICATION

This application claims the priority to Korean Patent Application No. 10-2014-0111858 filed on Aug. 26, 2014, with the Korean Intellectual Property Office, the disclosure of which is incorporated herein by reference.

BACKGROUND

The present disclosure relates to a method for manufacturing a semiconductor device.

With developments in industry and the growth multimedia, semiconductor devices used in computers, mobile equipment, and the like, have been required to have high degrees of integration and high performance. Such increases in integration have spurred a design rule for semiconductor devices to be finer, and thus, a reduction in resistance of conductive patterns such as metal lines or gate electrodes of semiconductor devices is a critical factor.

SUMMARY

Embodiments of the present inventive concept may provide a method for manufacturing a semiconductor device, capable of reducing or possibly preventing oxidation of a gate electrode of a semiconductor device to suppress increases in resistance of the gate electrode.

According to example embodiments of the present inventive concept, a method for manufacturing a semiconductor device may include providing a substrate including a metal layer including an oxidized surface layer in a heat treatment chamber, generating hydrogen radicals within the heat treatment chamber and reducing the oxidized surface layer of the metal layer using the hydrogen radical.

The generating of hydrogen radicals may include supplying gaseous hydrogen and gaseous oxygen to the interior of the chamber.

The gaseous hydrogen and the gaseous oxygen may be supplied in a flow ratio of about 2:3.

A temperature of interior of the chamber may range from about 400° C. to about 700° C.

Pressure in the interior of the chamber may range from about 1 torr to about 20 torr.

The metal layer may include tungsten (W).

According to some embodiments of the present inventive concept, a method for manufacturing a semiconductor device may include forming gate structures, each including at least one gate electrode including an oxidized surface, on a substrate, forming an oxide film to cover the gate structures and heat-treating the gate structures, wherein the heat-treating of the gate structures may include providing the substrate including the gate electrodes each including the oxidized surface layer in a heat treatment chamber, generating hydrogen radicals within the heat treatment chamber and reducing the oxidized surface layers of the gate electrodes using the hydrogen radical.

The gate structures may each further include a tunneling dielectric layer, an electric charge storage layer, and a blocking dielectric layer sequentially stacked between the substrate and the gate electrodes, and the gate electrodes may include a metal layer.

The reducing of the oxidized surface layers of the gate electrodes may be reducing a metal oxide to a metal.

The metal oxide includes tungsten oxide and the metal includes tungsten.

The generating of hydrogen radicals may include supplying gaseous hydrogen and gaseous oxygen in a flow ratio of about 2:3 to the interior of the chamber.

A temperature of interior of the chamber may range from about 400° C. to about 700° C.

Pressure in the interior of the chamber may range from about 1 torr to about 20 torr.

According to some embodiments of the present inventive concept, a method for manufacturing a semiconductor device may include forming gate structures, each including a plurality of gate electrodes, a plurality of interlayer insulating layers alternately stacked with the plurality of gate electrodes, channels penetrating through the plurality of gate electrodes and the plurality of interlayer insulating layers, and gate dielectric layers disposed between the channels and the gate electrodes, on a substrate, forming an oxide film to cover the gate structures and heat-treating the gate structures, wherein the heat-treating of the gate structures comprises providing the substrate including the gate electrodes each having the oxidized surface layer in a heat treatment chamber, generating hydrogen radicals within the heat treatment chamber and reducing the oxidized surface layers of the gate electrodes using the hydrogen radical.

The reducing of the oxidized surface layers of the gate electrodes is reducing a metal oxide to a metal.

The metal oxide includes tungsten oxide and the metal includes tungsten.

The generating of hydrogen radicals comprises supplying gaseous hydrogen and gaseous oxygen in a flow ratio of about 2:3 to the interior of the chamber.

A temperature of interior of the chamber ranges from about 400° C. to about 700° C.

Pressure in the interior of the chamber ranges from about 1 torr to about 20 torr.

The gate dielectric layers may each include a tunneling dielectric layer, an electric charge storage layer, and a blocking dielectric layer which are sequentially disposed.

BRIEF DESCRIPTION OF DRAWINGS

The above and other aspects, features and other advantages of the present inventive concept will be more clearly understood from the following detailed description taken in conjunction with the accompanying drawings, in which.

DETAILED DESCRIPTION

Figure 1:
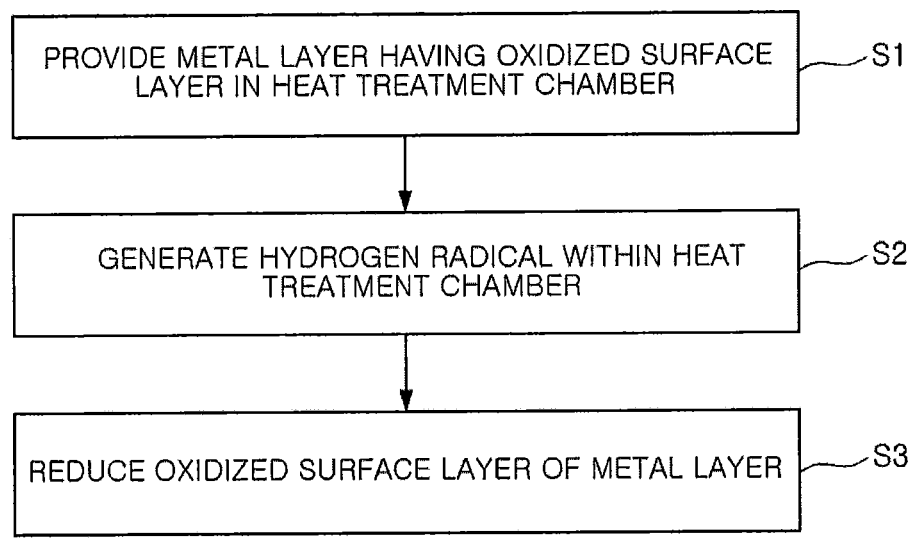
FIG. 1 is a flow chart illustrating a method for manufacturing a semiconductor device according to some embodiments of the present inventive concept.

Hereinafter, some embodiments of the present inventive concept will be described in detail with reference to the accompanying drawings.

The inventive concept may, however, be exemplified in many different forms and should not be construed as being limited to the specific embodiments set forth herein. Rather, these embodiments are provided so that this inventive concept will be thorough and complete, and will fully convey the scope of the disclosure to those skilled in the art. In the drawings, the shapes and dimensions of elements may be exaggerated for clarity, and the same reference numerals will be used throughout to designate the same or like elements.

Figure 2:
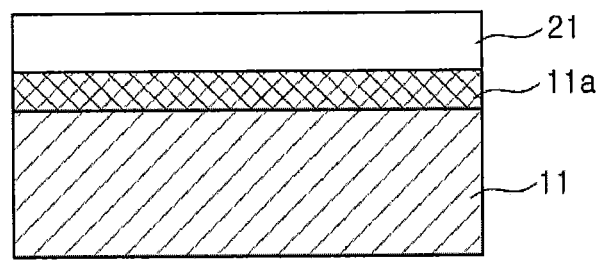
FIGS. 2 through 4 are cross-sectional views illustrating the method for manufacturing a semiconductor device according to some embodiments of the present inventive concept.
Figure 3:
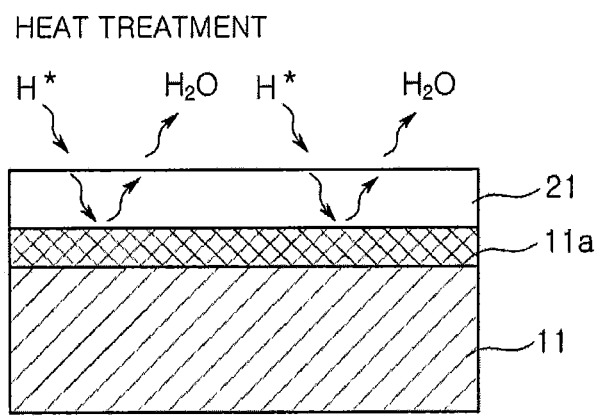
Figure 4:
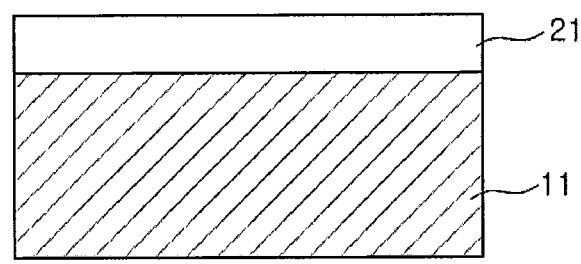

FIG. 1 is a flow chart illustrating a method for manufacturing a semiconductor device according to some embodiments of the present inventive concept. FIGS. 2 through 4 are cross-sectional views illustrating the method for manufacturing a semiconductor device according to some embodiments of the present inventive concept.

Referring to FIG. 2, a metal layer 11, an oxidized surface layer 11a of metal layer, and an oxide film layer 21 may be formed on a substrate. The metal layer 11 may include, for example, tungsten (W), aluminum (Al), copper (Cu), and the like. The oxide film layer 21 may be, for example, a silicon oxide film, a high temperature oxide (HTO), a high density plasma (HDP) oxide, a tetraethylorthosilicate (TEOS), a borophosphosilicate glass (BPSG), and an undoped silicate glass (USG).

In some embodiments, the metal layer 11 may include tungsten (W) and the oxide film layer 21 may include a silicon oxide film.

The metal layer 11 and the oxide film layer 21 may be formed through an atomic layer deposition (ALD) process or a chemical vapor deposition (CVD) process.

The oxidized surface layer 11a of metal layer may be formed when the oxide layer 21 is formed on an upper surface of metal layer 11. According to some embodiments, a portion of the oxidized surface layer 11a of metal layer may be formed through a separate oxidation process, and the remaining portion of the oxidized surface layer 11a may be formed as the metal layer 11 is additionally oxidized when the oxide film layer 21 is formed in a follow-up process.

Referring to FIGS. 1, 3, and 4, the oxidized surface layer 11a of metal layer may be reduced to the metal layer 11 by performing heat treatment using hydrogen radicals (H*).

In detail, after the substrate including the metal layer 11, the oxidized surface layer 11a of metal layer, and the oxide film layer 21 formed thereon is provided within a heat treatment chamber (S1 of FIG. 1), the interior of the heat treatment chamber may be adjusted to a predetermined pressure and a predetermined temperature. The pressure may be varied within a range from about 1 torr to about 20 torr, and the temperature may be varied within the range from about 400° C. to about 700° C. For example, pressure and temperature within the heat treatment chamber may range from about 5.0 torr to about 8.0 torr and about 550° C. to 650° C., respectively. In order to adjust pressure within the heat treatment chamber, inert gases may be supplied. The inert gases may be, for example, an argon (Ar) gas or a nitrogen ($N_2$) gas.

Hydrogen radicals (H*) having strong reducing power may be generated by supplying gaseous hydrogen and gaseous oxygen to the interior of the heat treatment chamber adjusted to have the predetermined pressure and temperature (S2 in FIG. 1). According to some embodiments, the gaseous hydrogen and the gaseous oxygen may be simultaneously supplied. According to some embodiments, the hydrogen gas may be supplied first, and the oxygen gas may be subsequently supplied. A flow ratio between the gaseous hydrogen and the gaseous oxygen supplied to the interior of the heat treatment chamber may appropriately be adjusted according to the pressure and temperature within the heat treatment chamber. For example, a flow ratio between gaseous hydrogen and gaseous oxygen supplied to the interior of the heat treatment chamber in which the pressure and temperature have been adjusted to range from about 5.0 torr to 8.0 torr and about 550° C. to 650° C., respectively, may be 2:3. Specifically, gaseous hydrogen equal to about 400 sccm and gaseous oxygen equal to about 600 sccm may be supplied to the interior of the heat treatment chamber within the predetermined range of pressure.

The generated hydrogen radicals (H*) may be reacted with oxygen of the oxidized surface layer 11a of metal layer so as to be converted into water vapor ($H_2O$) and discharged to the outside of the heat treatment chamber, and accordingly, the oxidized surface layer 11a of metal layer may be reduced to the metal layer 11 (S3 of FIG. 1).

Figure 5:
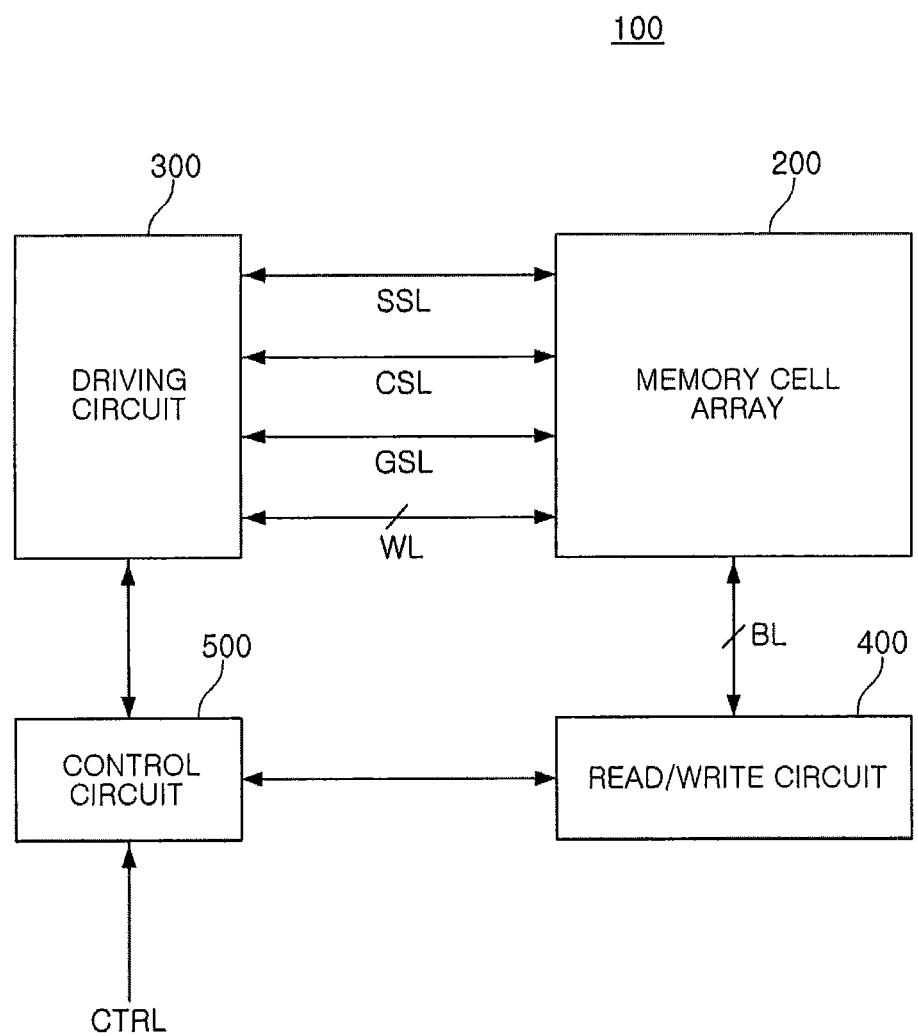
FIG. 5 is a block diagram schematically illustrating a semiconductor device according to some embodiments of the present inventive concept.

FIG. 5 is a block diagram schematically illustrating a semiconductor device according to some embodiments of the present inventive concept.

Referring to FIG. 5, a semiconductor device 100 according to some embodiments of the present inventive concept may include a memory cell array 200, a driving circuit 300, a read/write circuit 400, and a control circuit 500.

The memory cell array 200 may include memory cells, and the memory cells may be arranged in columns and rows. The memory cells included in the memory cell array 200 may be connected to the driving circuit 300 through a word line WL, a common source line CSL, a string select line SSL, a ground select line GSL, and the like, and may be connected to the read/write circuit 400 through a bit line BL. In some embodiments of the present inventive concept, memory cells arranged in the same row may be connected to the same word line WL, and memory cells arranged in the same column may be connected to the same bit line BL.

The memory cells included in the memory cell array 200 may be divided into memory blocks. Each of the memory blocks may include word lines WL, string select lines SSL, ground select lines GSL, bit lines BL, and at least one common source line CSL.

The driving circuit 300 and the read/write circuit 400 may be operated by the control circuit 500. In some embodiments of the present inventive concept, the driving circuit 300 may receive address information from the outside, decode the received address information, and select at least a portion of the word lines WL, common source lines CSL, string source lines SSL, and the ground select lines GSL connected to the memory cell array 200. The driving circuit 300 may include a driving circuit with respect to each of the word line WL, the string select line SSL, and the common source line CSL.

The read/write circuit 400 may select at least a portion of the bit lines BL connected to the memory cell array 200 according to a command received from the control circuit 500. The read/write circuit 400 may read data stored in a memory cell connected to the selected the bit lines 13L or write data to the memory cell connected to the selected the bit lines BL. In order to perform the foregoing operation, the read/write circuit 400 may include circuits such as a page buffer, an input/output buffer, a data latch, and the like.

The control circuit 500 may control operations of the driving circuit 300 and the read/write circuit 400 in response to a control signal CTRL transmitted from the outside. In the case of reading data stored in the memory cell array 200, the control circuit 500 may control an operation of the driving circuit 300 to supply a voltage for a reading operation to a word line WL that is connected to a memory cell from which the stored data is to be read. When the voltage for the reading operation is supplied to a particular word line WL, the control circuit 500 may control the read/write circuit 400 to read out data stored in a memory cell connected to the word line WL to which the voltage for a reading operation has been supplied.

Meanwhile, in the case of writing data to the memory cell array 200, the control circuit 500 may control an operation of the driving circuit 300 to supply a voltage for a write operation to a word line that is connected to a memory cell to which data is to be written. When the voltage for a write operation is supplied to a particular word line WL, the control circuit 500 may control the read/write circuit 400 to write data to a memory cell connected to the word line WL to which the voltage for a write operation has been supplied.

Figure 6:
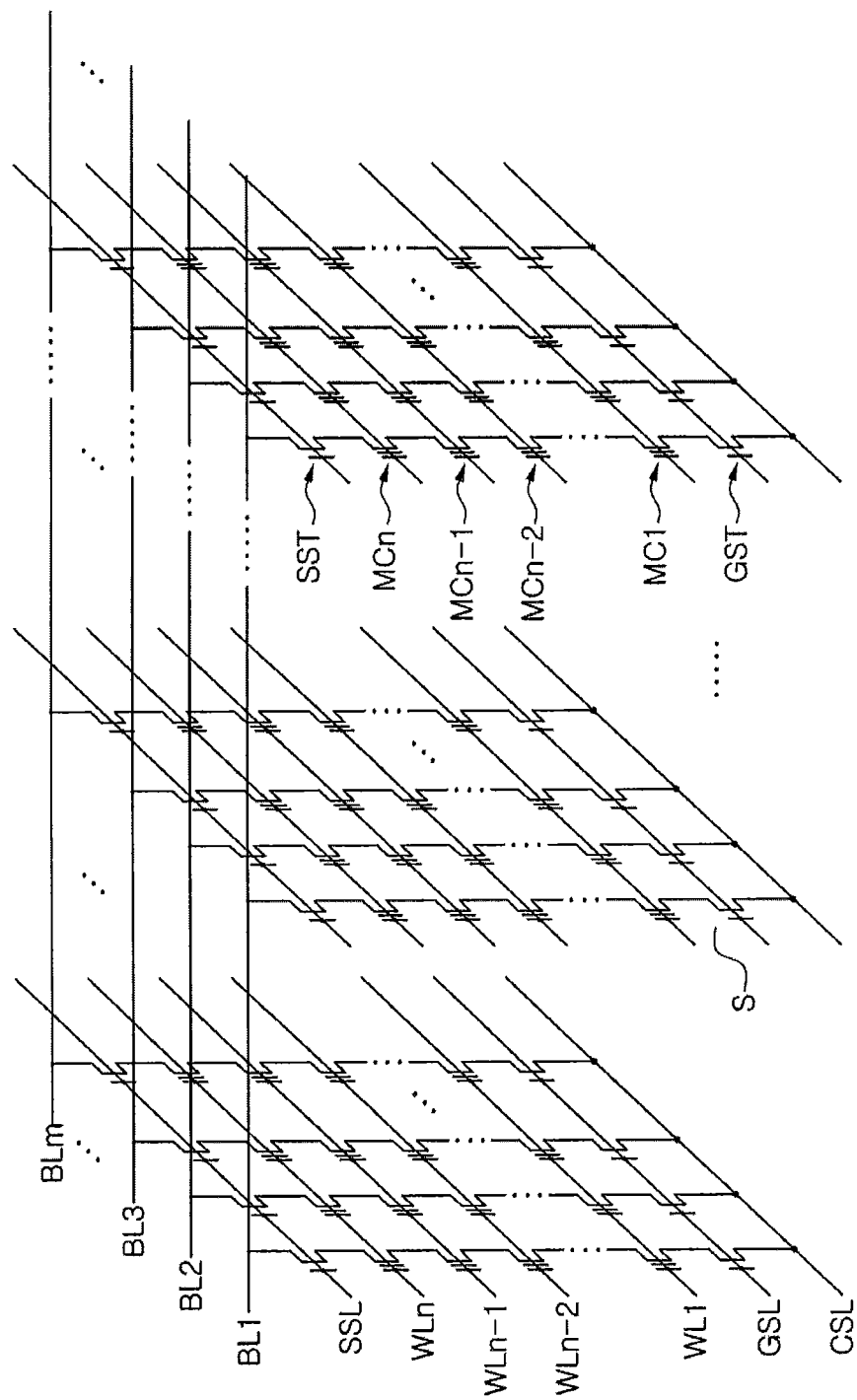
FIG. 6 is an equivalent circuit diagram of a memory cell array of a semiconductor device according to some embodiments of the present inventive concept.

FIG. 6 is an equivalent circuit diagram of a memory cell array of a semiconductor device according to some embodiments of the present inventive concept. The semiconductor device according to some embodiments of the present inventive concept may be a vertical-type non-volatile memory device.

Referring to FIG. 6, the memory cell array according to some embodiment may include memory cell strings including n number of memory cell elements MC1 to MCn connected in series, and a ground select transistor GST and a string select transistor SST connected in series to the respective ends of each cell string of memory cell elements MC1 to MCn.

The n number of memory cell elements MC 1 to MCn that are included in each cell string may be connected to word lines WL1 to WLn, respectively, for selecting at least a portion of the memory cell elements MC1 to MCn.

A gate terminal of the ground select transistor GST may be connected to the ground select line GSL, and a source terminal thereof may be connected to the common source line CSL. Meanwhile, a gate terminal of the string select transistor SST may be connected to the string select line SSL, and a source terminal thereof may be connected to a drain terminal of the memory cell element MCn. In FIG. 6, a structure in which the single ground select transistor GST and the single string select transistor SST are connected to the n number of memory cell elements MC 1 to MCn connected in series is illustrated, but alternatively, two or more ground select transistors GST and two or more string select transistors SST may also be connected to each cell string of the n number of memory cell elements MC1 to MCn.

A drain terminal of the string select transistor SST may be connected to the bit lines BL1 to BLm. When a signal is applied to the gate terminal of the string select transistor SST through the string select line SSL, a signal applied through the bit line BL1 to BLm may be delivered to the n number of memory cell elements MC1 to MCn connected in series to execute a data read or write operation. Also, by applying a signal to the gate terminal of the ground select transistor GST through the gate select line GSL, an erase operation to remove all electric charges stored in the n number of memory cell elements MC1 to MCn may be executed.

Figure 7:
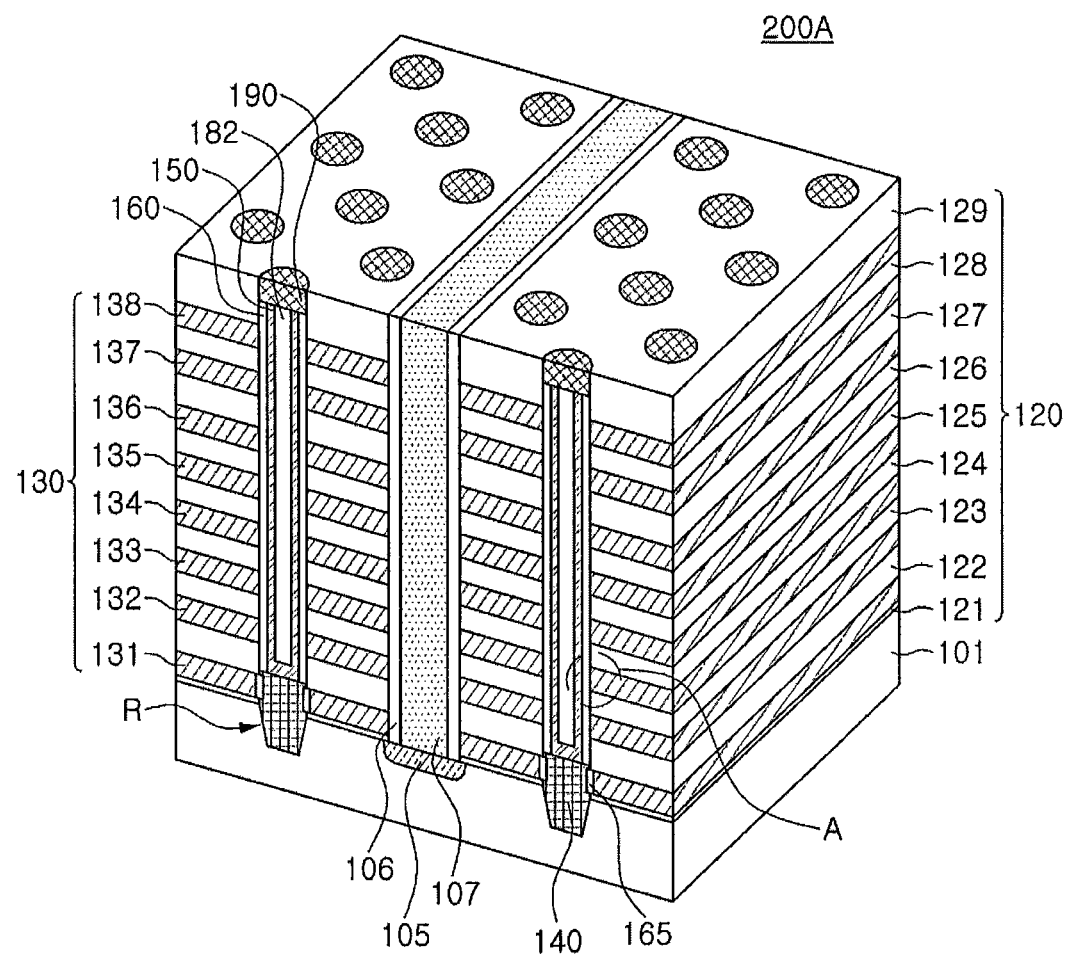
FIG. 7 is a perspective view schematically illustrating a partial structure of memory cell strings of a semiconductor device according to some embodiments of the present inventive concept.

FIG. 7 is a perspective view schematically illustrating a partial structure of memory cell strings of a semiconductor device according to some embodiments of the present inventive concept.

Referring to FIG. 7, a semiconductor device 200A may include a substrate 101, gate structures including interlayer insulating layers 120 and gate electrodes alternately stacked on the substrate 101, and channels 150 penetrating through the interlayer insulating layers 120 and the gate electrodes 130 in a direction perpendicular to an upper surface of the substrate 101. Also, the semiconductor device 200A may further include an epitaxial layer 140 disposed below the channels 150 on the substrate 101, a gate dielectric layer 160 disposed between the channels 150 and the gate electrodes 130, a common source line 107 disposed on a source region 105, and a drain pad 190 above the channels 150.

In the semiconductor device 200A, a single memory cell string may be formed around each channel 150, and a plurality of memory cell strings may be arranged in rows and columns in x and y directions.

The substrate 101 may have an upper surface extending in the x and y directions. The substrate 101 may include a semiconductive material, for example, Group IV semiconductor, Group III-V compound semiconductor, or Group II-VI oxide semiconductor. For example, Group IV semiconductor may include silicon, germanium, or silicon-germanium. The substrate 101 may be provided as a bulk wafer or an epitaxial layer.

The columnar channels 150 may be disposed to extend in a direction (z direction) perpendicular to the upper surface of the substrate 101. The channels 150 may have an annular shape surrounding the first insulating layer 182 therein, but according to some embodiments, the channels 150 may have a columnar shape such as a cylindrical shape or a prismatic shape without the first insulating layer 182. Also, the channels 150 may have a sloped lateral surface so that the channels 150 become narrower the closer it is to the substrate 101.

The channels 150 may be disposed to be spaced apart from one another in the x and y directions. However, the channels 150 may be variously disposed according to some embodiments, and, for example, the channels 150 may be disposed in zigzags in at least one direction. Also, the channels 150 adjacent to a common source line 107 interposed therebetween may be symmetrical, but the present inventive concept is not limited thereto.

Lower surfaces of the channels 150 may be electrically connected to the substrate 101 through the epitaxial layer 140. The channels 150 may include a semiconductive material such as polycrystalline silicon or single crystalline silicon, and here, the semiconductor material may be an undoped material or a material including p-type or n-type impurities.

The epitaxial layer 140 may be disposed below the channels 150 on the substrate 101. The epitaxial layer 140 may be disposed on a lateral surface of at least one gate electrode 130. In some embodiments, the epitaxial layer 140 may be disposed on lateral surfaces of two gate electrodes 130. By virtue of the epitaxial layer 140, even though an aspect ratio of the channels 150 is increased, the channels 150 may be stably electrically connected to the substrate 101 and characteristics of the ground select transistors GST between the memory cell strings may become uniform.

The epitaxial layer 140 may be a layer formed using selective epitaxy growth (SEG). The epitaxial layer 140 may include polycrystalline silicon, single crystalline silicon, polycrystalline germanium, or single crystalline germanium which is doped with an impurity or undoped. For example, in a case in which the substrate 101 is single crystalline silicon (Si), the epitaxial layer 140 may also be single crystalline silicon. However, in some embodiments, even in a case in which the substrate 101 is single crystalline silicon, at least a portion of the epitaxial layer 140 may have a polycrystalline silicon structure including a plurality of grains.

An epitaxial insulating layer 165 may be disposed between the epitaxial layer 140 and an adjacent gate electrode 131. The epitaxial layer 165 may serve as a gate insulating layer of the ground select transistor GST. The epitaxial insulating layer 165 may be an oxide film formed by thermally oxidizing a portion of the epitaxial layer 140. For example, the epitaxial insulating layer 165 may be a silicon oxide film ($SiO_2$) formed by thermally oxidizing the silicon epitaxial layer 140.

A plurality of gate electrodes 130 (specifically, gate electrodes 131 to 138 in the embodiment of FIG. 7) may be disposed to be spaced apart from one another in the z direction along the lateral surfaces of the channels 150 from the substrate 101. Referring to FIG. 6 together, each of the gate electrodes 130 may form a gate of each of a ground select transistor GST, a plurality of memory cells MC1 to MCn, and a string select transistor SST. The gate electrodes 130 may extend to form the word lines WL1 to WLn, and may be commonly connected in a predetermined unit of adjacent memory strings arranged in the x and y directions. In some embodiments, five gate electrodes 132 to 136 of the memory cells MC1 to MCn are arranged, but the present inventive concept is not limited thereto and the number of the gate electrodes 130 constituting the memory cells MC1 to MCn may be determined depending on storage capacity of the semiconductor device 100. For example, the number of gate electrodes 130 constituting the memory cells MC1 to MCn may be $2^r$ (where r is a natural number).

The gate electrode 131 of the ground select transistor GST may extend in the y direction to form a ground select line GSL. For a function of the ground select transistor GST, a predetermined impurity may also be doped in the substrate 101 below the gate electrode 131.

The gate electrodes 137 and 138 of the string select transistor SST may extend in the y direction to form the string select line SSL. In particular, the gate electrodes 137 and 138 of the string select transistor SST may be discontinuous in x direction between adjacent the memory cell strings to form different string select lines SSL. According to some embodiments, the string select transistor SST and the ground select transistor GST may have one or two or more gate electrodes 137 and 138 and may have one or two or more gate electrodes 137 and 138 or one or two or more gate electrodes 131, and may have a structure different from that of the gate electrodes 132 to 136 of the memory cells MC1 to MCn.

Also, a portion of gate electrodes 130, for example, gate electrodes 130 adjacent to the gate electrode 131 of the ground select transistor GST or the gate electrodes 137 and 138 of the string select transistor SST may be dummy gate electrodes. For example, the gate electrode 132 adjacent to the gate electrode 131 of the ground select transistor GST may be a dummy gate electrode.

The gate electrodes 130 may include polycrystalline silicon or metal silicide material. The metal silicide material may be silicide material of a metal selected from among cobalt (Co), nickel (Ni), hafnium (Hf), platinum (Pt), tungsten (W), and titanium (Ti), or any combination thereof. According to some embodiments, the gate electrodes 130 may include a metal, for example, tungsten (W), aluminum (Al), copper (Cu), and the like. Also, a diffusion barrier may be disposed to surround the gate electrodes 130, and the diffusion barrier may include, for example, a tungsten nitride (WN), tantalum nitride (TaN), and titanium nitride (TiN), or any combination thereof.

Like the gate electrodes 130, the plurality of interlayer insulating layers 120 (specifically, interlayer insulating layers 121 to 129 in the embodiment of FIG. 7) may be arranged to be spaced apart from one another in the z direction and extend in the y direction. The interlayer insulating layers 120 may include an insulating material such as silicon oxide or silicon nitride.

The gate dielectric layer 160 may be disposed between the gate electrodes 130 and the channels 150. Although not specifically illustrated in FIG. 7, the gate dielectric layer 160 may include a tunneling dielectric layer, an electric charge storage layer, and a blocking dielectric layer sequentially stacked on the channels 150. This will be described in detail with reference to FIGS. 8A through 8C hereinafter.

Electric charges may tunnel through the tunneling dielectric layer to the electric charge storage layer in a Fowler-Nordheim (F-N) manner. The tunneling dielectric layer may include, for example, a silicon oxide. The electric charge storage layer may be an electric charge trap layer or a floating gate conductive layer. For example, the electric charge storage layer may include a dielectric material, quantum dots, or nanocrystals. Here, the quantum dots or the nanocrystals may be formed of microparticles of a conductor, for example, a metal or a semiconductor. In some embodiments, when the electric charge storage layer is an electric charge trap layer, the electric charge storage layer may be formed of a silicon nitride.

The blocking layer may include a high-k dielectric material. Here, the high-k dielectric material refers to a dielectric material having a dielectric constant higher than that of a silicon oxide film.

In an upper end of the memory cell string, a drain pad 190 may be disposed to cover an upper surface of the first insulating layer 182 and be electrically connected to the channels 150. The drain pad 190 may include doped polycrystalline silicon, for example. The drain pad 190 may act as a drain region of the string select transistor SST. Although not shown, the drain pad 190 may be electrically connected to the bit line BL formed on the drain pad 190. The bit line 13L may extend, while connecting the drain pads 190 arranged in the x direction, and a conductive contact plug may be disposed between the drain pad 190 and the bit line BL.

Source regions 105 of the ground select transistors GST (please refer to FIG. 6) arranged in the x direction may be disposed in lower ends of the memory cell strings. The source regions 105 may be adjacent to the upper surface of the substrate 101, extend in the y direction, and be spaced apart from one another by a predetermined unit in the x direction. For example, one source region 105 may be arranged in every two channels 150 in the x direction, but the present inventive concept is not limited thereto. A common source line 107 may be formed on each source region 105 and extend in the y direction along the source region 105. The common source line 107 may include a conductive material. For example, the common source line 107 may include tungsten (W), aluminum (Al), copper (Cu), and the like. The common source line 107 may be electrically separated from the gate electrodes 130 by the second insulating layer 106.

Figure 8A:
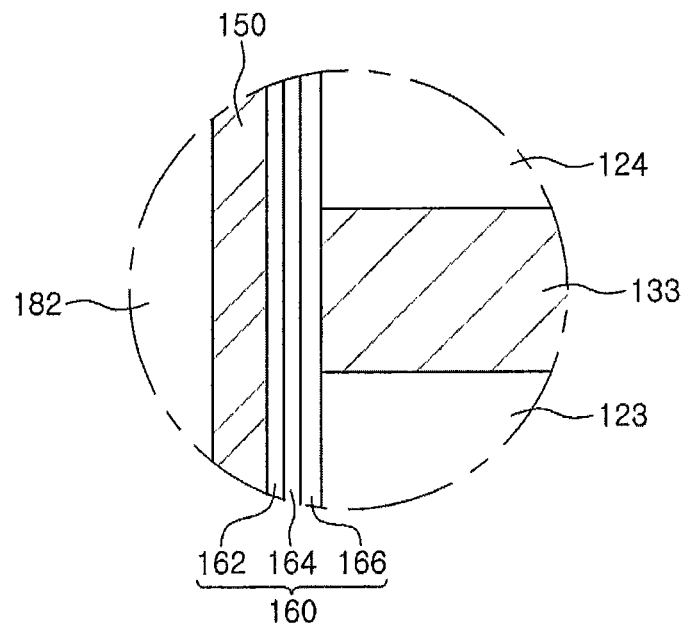
FIGS. 8A through 8C are enlarged cross-sectional views of region "A" of FIG. 7 illustrating a gate dielectric layer according to some embodiments of the present inventive concept.
Figure 8B:
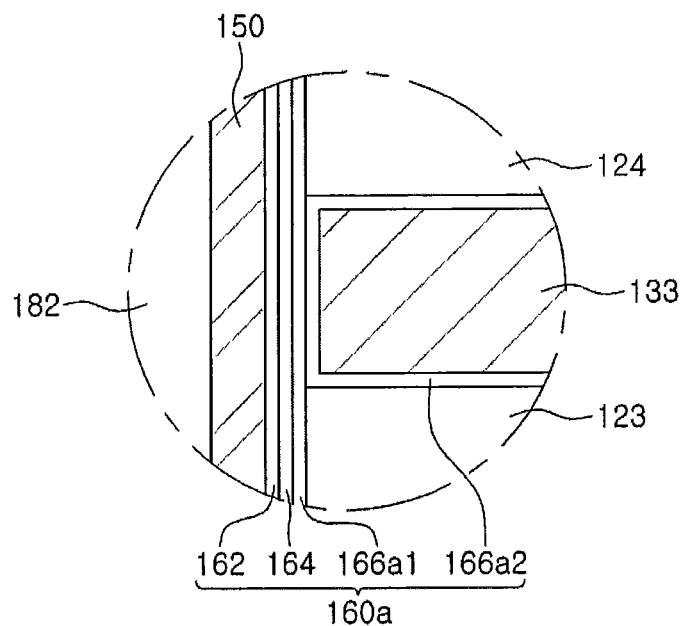
Figure 8C:
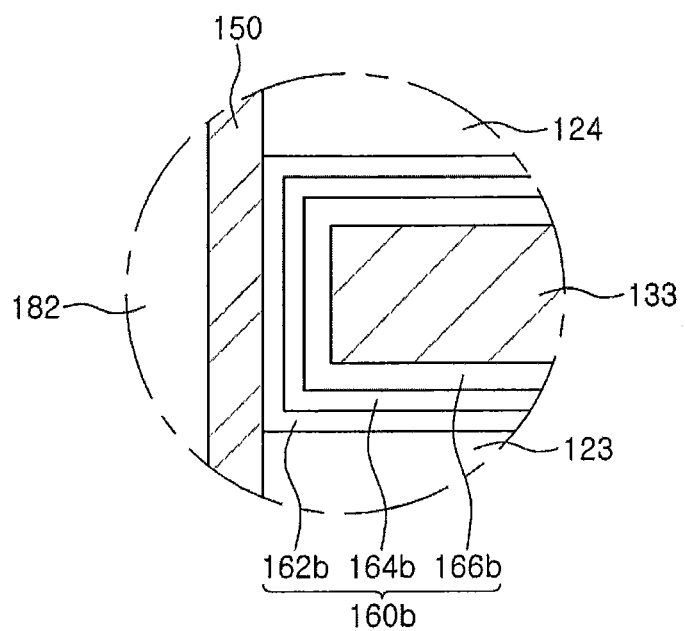

FIGS. 8A through 8C are enlarged cross-sectional views of region "A" of FIG. 7 illustrating a gate dielectric layer according to some embodiments of the present inventive concept.

Referring to FIG. 8A, a gate electrode 133, the gate dielectric layer 160, the channels 150 and the first insulating layer 182 are illustrated. The gate dielectric layer 160 may have a structure in which a tunneling dielectric layer 162, an electric charge storage layer 164, and a blocking dielectric layer 166 are sequentially stacked on the channels 150. Relative thicknesses of the layers forming the gate dielectric layer 160 are not limited to the thicknesses illustrated in the drawing and may be variously modified.

The tunneling dielectric layer 162, the electric charge storage layer 164, and the blocking dielectric layer 166 may vertically extend along the channels 150.

The tunneling dielectric layer may include a silicon oxide ($SiO_2$), a silicon nitride ($Si_3N_4$), a silicon oxynitride (SiON), a hafnium oxide ($HfO_2$), hafnium silicon oxide ($HfSi_xO_y$), an aluminum oxide ($Al_2O_3$), a zirconium oxide ($ZrO_2$), and any combination thereof.

The electric charge storage layer 164 may be an electric charge trap layer or a floating gate conductive film. In a case in which the electric charge storage layer 164 is a floating gate conductive film, the electric charge storage layer 164 may be formed by depositing polycrystalline silicon through low pressure chemical vapor deposition (LPCVD), for example. In a case in which the electric charge storage layer 164 is an electric charge trap layer, the electric storage layer 164 may include a silicon oxide ($SiO_2$), a silicon nitride ($Si_3N_4$), a silicon oxynitride (SiON), a hafnium oxide ($HfO_2$), a zirconium oxide ($ZrO_2$), a tantalum oxide ($Ta_2O_3$), a titanium oxide ($TiO_2$), a hafnium aluminum oxide ($HfAl_xO_y$), a hafnium tantalum oxide ($HfTa_xO_y$), a hafnium silicon oxide ($HfSi_xO_y$), an aluminum nitride ($AlN_y$), an aluminum gallium nitride($AlGa_xN_y$), or any combination thereof.

The blocking dielectric layer 166 may include a silicon oxide ($SiO_2$), a silicon nitride ($Si_3N_4$), a silicon oxynitride (SiON), a high-k dielectric material, or any combination thereof. The high-k dielectric material may include an aluminum oxide ($Al_2O_3$), a tantalum oxide ($Ta_2O_3$), a titanium oxide ($TiO_2$), an yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), a praseodymium oxide ($Pr_2O_3$), or any combination thereof.

Referring to FIG. 8B, a gate electrode 133, a diffusion barrier 170, a gate dielectric layer 16a, channels 150, and a first insulating layer 182 of memory cell strings are illustrated. The gate dielectric layer 160a may have a structure in which a tunneling dielectric layer 162, an electric charge storage layer 164, and blocking dielectric layers 166a1 and 166a2 are sequentially stacked on the channels 150. In particular, different from the device of FIG. 8A, the gate dielectric layer 160a may include two blocking dielectric layers 166a1 and 166a2, and the first blocking dielectric layer 166a1 may extend vertically like the channels 150 and the second blocking dielectric layer 166a2 may be disposed to surround the gate electrode layer 133. For example, the first blocking dielectric layer 166a1 has a relatively low dielectric constant relative to the second blocking dielectric layer and the second blocking dielectric layer may be a high-k dielectric layer.

In some embodiments, the first blocking dielectric layer 166a1 may be omitted and a single blocking dielectric layer may be disposed to surround the gate electrode layer 133.

Referring to FIG. 8C, a gate electrode 133, a gate dielectric layer 160b, channels 150, and a first insulating layer 182 are illustrated. The gate dielectric layer 160b may have a structure in which a tunneling dielectric layer 162b, an electric charge storage layer 164b, and a blocking dielectric layer 166b are sequentially stacked on the channels 150.

In particular, different from the devices of FIGS. 8A and 8B, all the tunneling dielectric layer 162b, the electric charge storage layer 164b, and the blocking dielectric layer 166b of the gate dielectric layer 160b may be disposed to surround the gate electrode layer 133.

FIGS. 9 through 16 are views illustrating major processes of a method for manufacturing a semiconductor device according to some embodiments of the present inventive concept.

Figure 9:
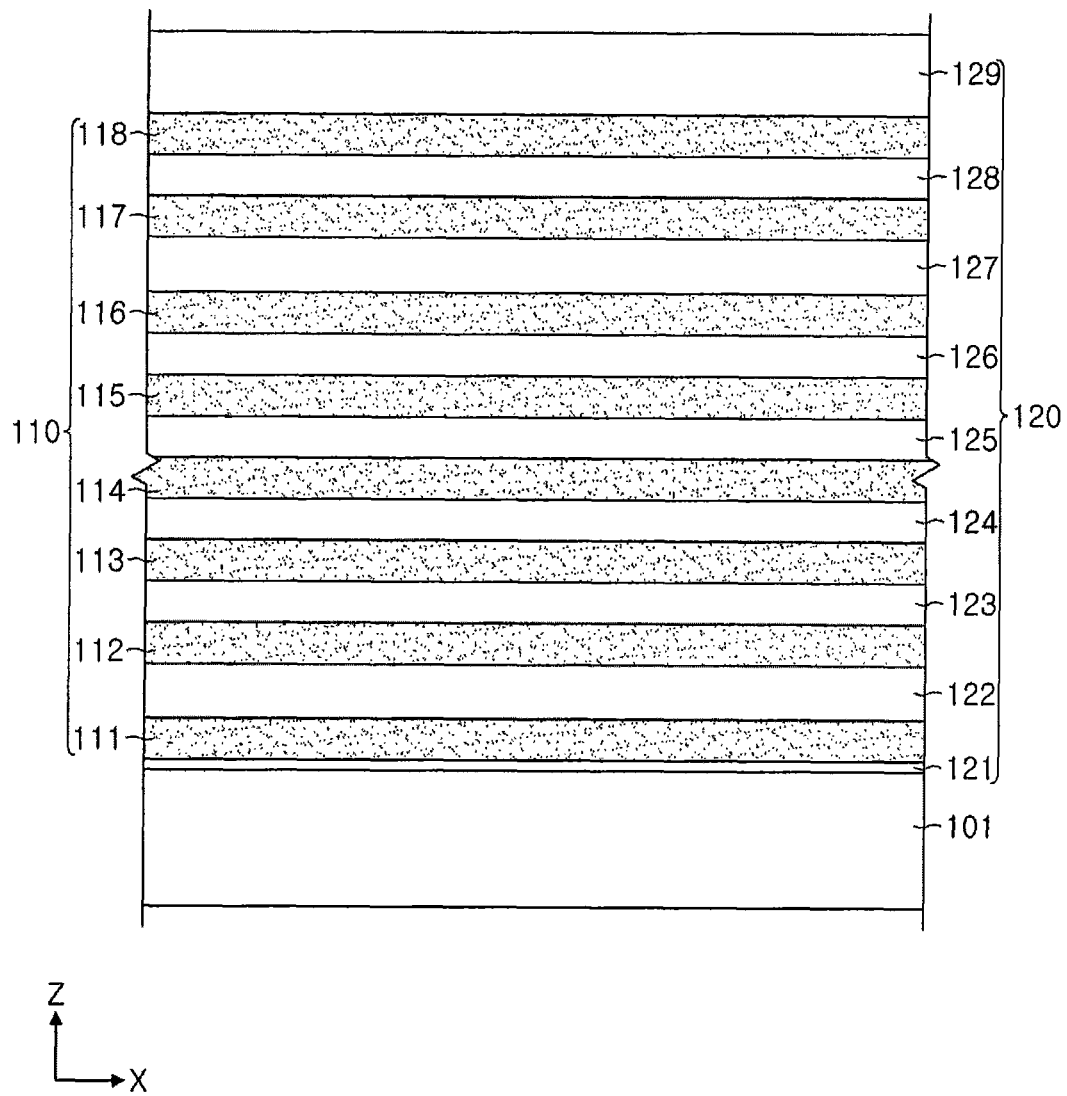
FIGS. 9 through 16 are views illustrating major processes of a method for manufacturing a semiconductor device according to some embodiments of the present inventive concept.

Referring to FIG. 9, interlayer sacrificial layers 110 (specifically, interlayer sacrificial layers 111 to 116 in FIG. 9) and interlayer insulating layers 120 (specifically, interlayer sacrificial layers 121 to 129 in FIG. 9) may be alternately stacked on the substrate 101. Here, the interlayer insulating layers 120 and the interlayer sacrificial layers 110 may be alternately stacked, starting from the first interlayer insulating layer 121.

The interlayer sacrificial layers 110 may be formed of a material that may be etched with etch selectivity with respect to the interlayer insulating layers 120. Namely, the interlayer sacrificial layers 110 may be formed of a material that may be etched, while minimizing etching of the interlayer insulating layers 120 during a process of etching the interlayer sacrificial layers 110. The etch selectivity may be quantatively expressed by a ratio of an etching rate of the interlayer sacrificial layers 110 to an etching rate of the interlayer insulating layers 120. For example, the interlayer insulating layers 120 may be formed of at least one of a silicon oxide and a silicon nitride, and the interlayer sacrificial layers 110 may be formed of a material different from that of the interlayer insulating layers 120, selected from among silicon, a silicon oxide, a silicon carbide, and a silicon nitride.

As illustrated, in some embodiments, the thicknesses of the interlayer insulating layers 120 may be different each other. The lowermost interlayer insulating layer 121, among the interlayer insulating layers 120, may be formed to be relatively thin, while the uppermost interlayer insulating layer 129 may be formed to be relatively thick. Also, the interlayer insulating layers 122 and 127 disposed between the ground select transistor GST and the string select transistor SST and the memory cells MC1 to MCn may be formed to be thicker than the interlayer insulating layers 123 to 126 disposed between the memory cells MC1 to MCn. However, the thicknesses of the interlayer insulating layers 140 and the interlayer sacrificial layers 110 may be variously modified from those illustrated ones, and the number of the films constituting the interlayer insulating layers 140 and the interlayer sacrificial layers 110 may also be variously modified.

In some embodiments, a predetermined amount of impurity may be doped in the substrate 101 corresponding to a lower portion of a region in which the gate electrode 131 is to be disposed in FIG. 7, for an electrical operation between the common source line 107 and the ground select transistor GST.

Figure 10:
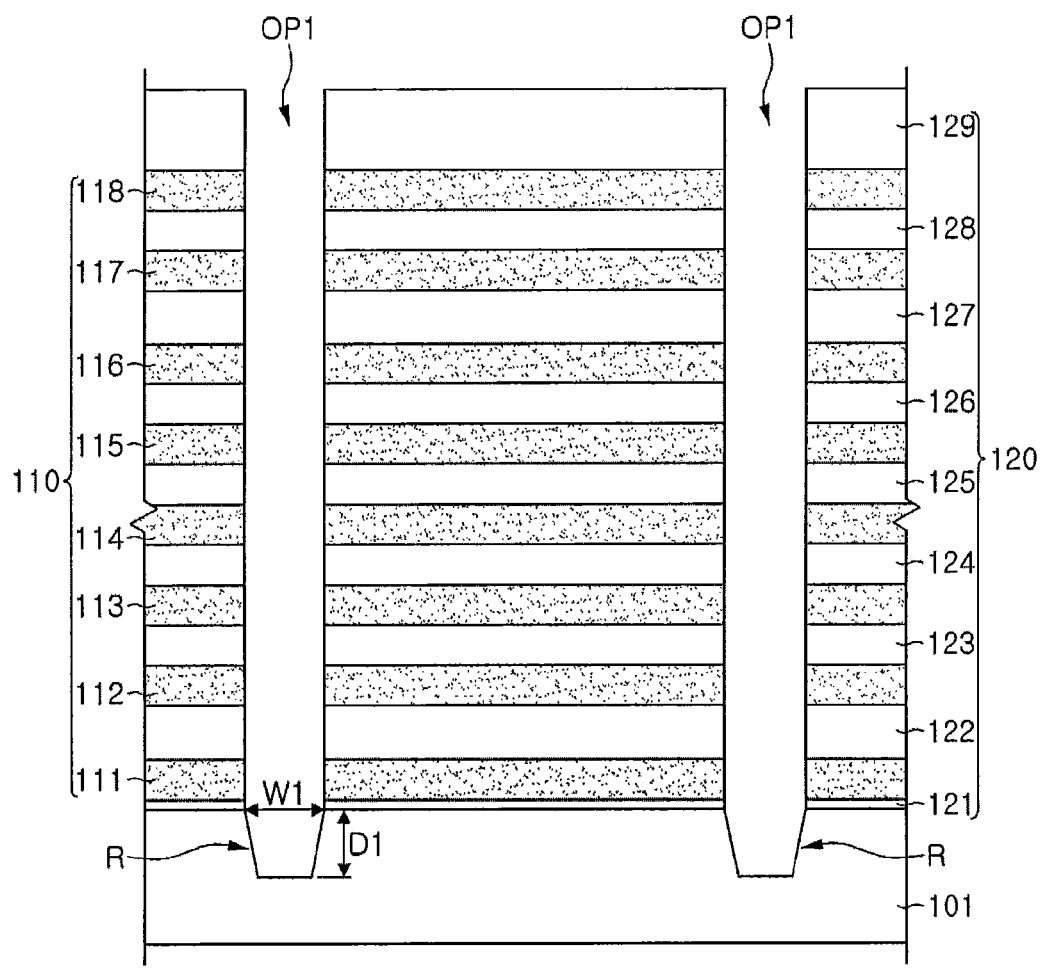

Referring to FIG. 10, first openings OP1 may be formed as holes penetrating through the interlayer sacrificial layers 110 and the interlayer insulating layers 120.

The first openings OP1 may extend to the substrate 101 in the z direction to form recess regions R within the substrate 101. The first openings OP1 may be formed by anisotropically etching the interlayer sacrificial layers 110 and the interlayer insulating layers 120. Since the stacked structure including two types of different films are etched, side walls of the first openings OP1 may not be perpendicular to the upper surface of the substrate 101. For example, the widths of the first openings OP1 may be reduced toward the upper surface of the substrate 101.

The depth D1 of the recess region R may be selected according to widths and aspect ratios of the first openings OP1. For example, the depth D1 of the recess region R may be about 0.3 to 1.0 times the width W1 of the opening OP1 on the upper surface of the substrate 101, but the present inventive concept is not limited thereto.

Figure 11:
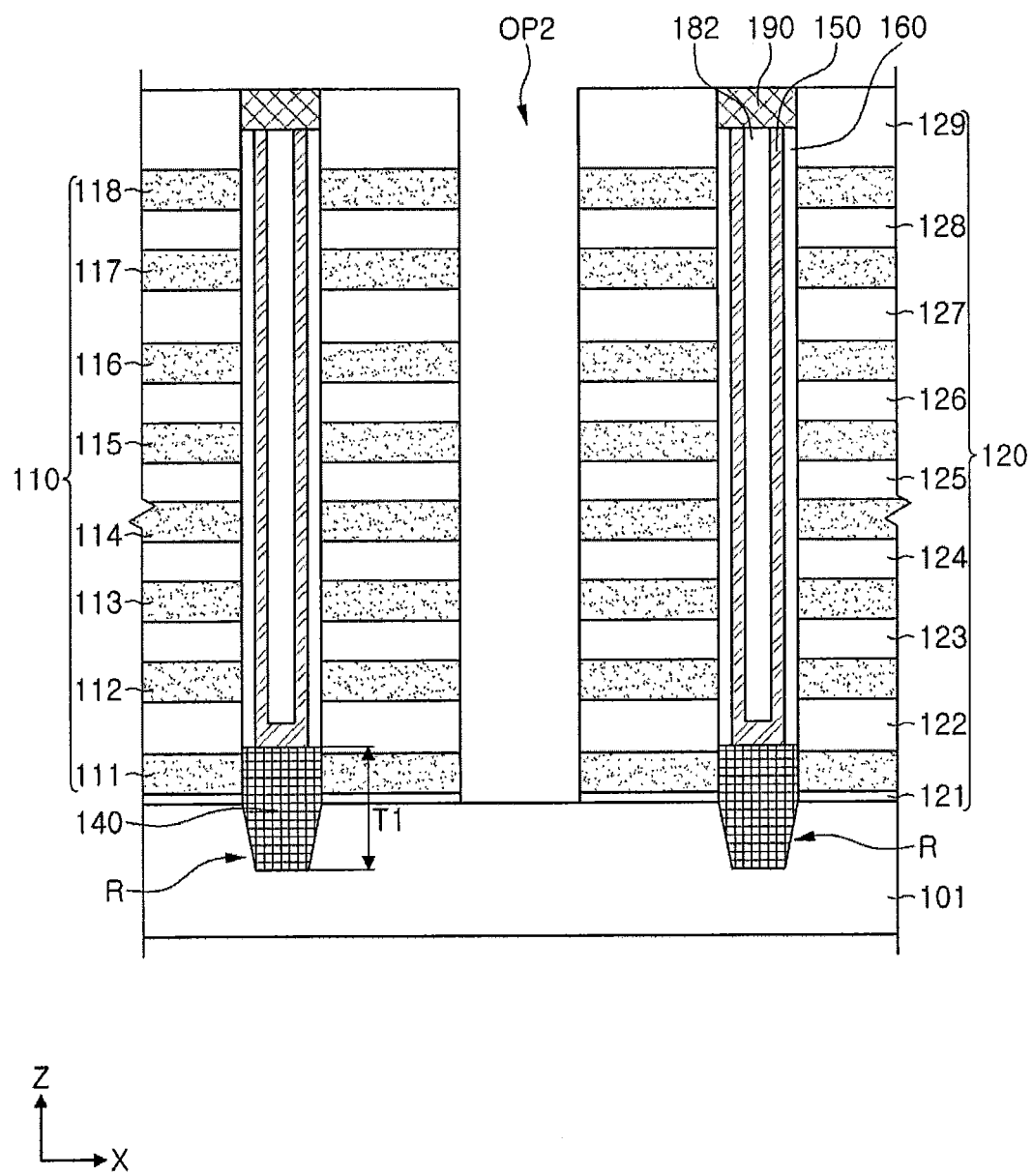

Referring to FIG. 11, the epitaxial layer 140 may be formed within the recess regions R in lower portions of the first openings OP1.

The epitaxial layer 140 may be formed by performing a selective epitaxial growth (SEG). The epitaxial layer 140 may be formed such that an upper surface thereof is higher than an upper surface of the sacrificial layer 111 adjacent to the substrate 101 and lower than a lower surface of the sacrificial layer 112 thereabove.

An upper surface of the epitaxial layer 140 may be formed to be flat as illustrated. However, the upper surface of the epitaxial layer 140 may be sloped depending on a growth condition, or the like.

Subsequently, the gate dielectric layer 160 is formed within the first openings OP1.

The gate dielectric layer 160 may be formed to have a uniform thickness by using atomic layer deposition (ALD) or chemical vapor deposition (CVD). During this process, the entirety or only a portion of the gate dielectric layer 160 may be formed as in the devices described above with reference to FIGS. 8A through 8C.

Subsequently, a portion of the gate dielectric layer 160 may be removed within the first openings OP1 to expose a portion of the upper surface of the epitaxial layer 140, and the channels 150 may be formed on the exposed epitaxial layer 140 and the gate dielectric layer 160. When a portion of the gate dielectric layer is exposed, a portion of the epitaxial layer 140 may be removed to form a recess in an upper portion of the epitaxial layer 140. The channels 150 may be in contact with the epitaxial layer 140 on an upper surface of the epitaxial layer 140 so as to be connected.

Subsequently, a first insulating layer 182 may be formed to fill the first openings OP1 and a drain pad 190 may be formed on the first insulating layer 182. The first insulating layer 182 may be formed of an insulating material. However, in some embodiments, a gap between the channels 150 may be filled with a conductive material, rather than the first insulating layer 182.

Thereafter, the second opening OP2 may be formed to separate the stacked interlayer sacrificial layers 110 and the interlayer insulating layers 120 at a predetermined distance. The second opening OP2 may be formed by forming a mask layer using a photolithography process and anisotropically etching the stacked interlayer sacrificial layers 110 and the interlayer insulating layers 120. The second opening OP2 may be formed to have the form of a trench extending in the y direction (please refer to FIG. 7). In some embodiments, before the second opening OP2 is formed, an insulating layer may be additionally formed on the uppermost interlayer insulating layer 129 and the drain pad 190 to prevent damage to the drain pad 190 and the channels 150 therebelow. The second opening OP2 may expose the substrate 101 between the channels 150.

Figure 12:
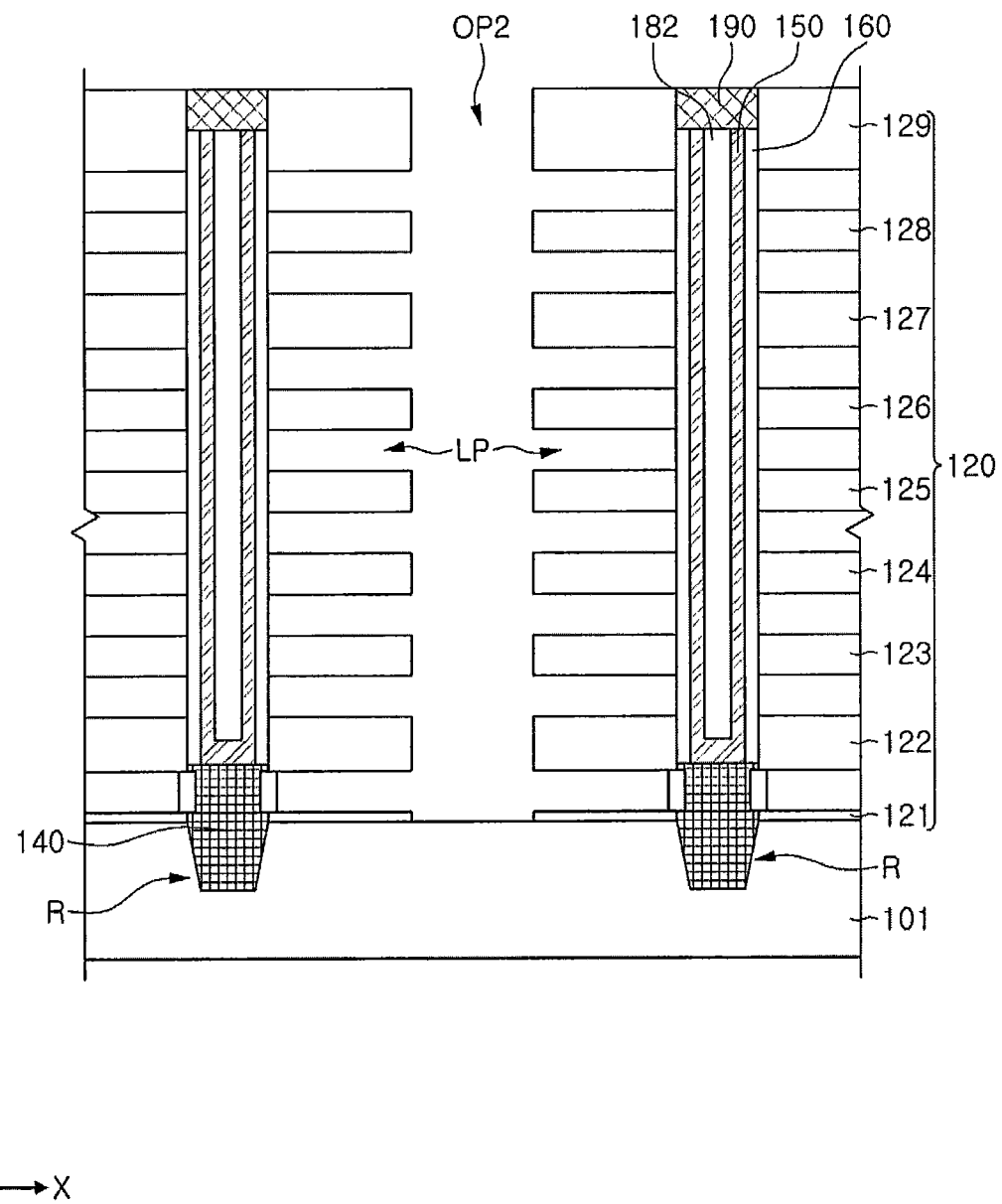

Referring to FIG. 12, the sacrificial layers 110 exposed through the second opening OP2 may be removed by an etching process, and accordingly, lateral openings LP defined between the interlayer insulating layers 120 may be formed. Lateral surfaces of the gate dielectric layer 160 and the epitaxial layer 140 may be partially exposed through the lateral openings LP.

Thereafter, the epitaxial insulating layers 165 may be formed on the epitaxial layer 140 exposed through the lateral openings LP. The epitaxial insulating layers 164 may be formed through, for example, a thermal oxidation process, and in this case, the epitaxial insulating layers 165 may be oxide films formed as portions of the epitaxial layers 140 are oxidized. Thicknesses and shapes of the epitaxial insulating layers 164 are not limited to those illustrated.

In a case in which a thermal oxidation process is performed in this stage, etch damage done to the gate insulating layer 160 exposed through the lateral openings LP when the interlayer sacrificial layers was etched may be cured.

Figure 13:
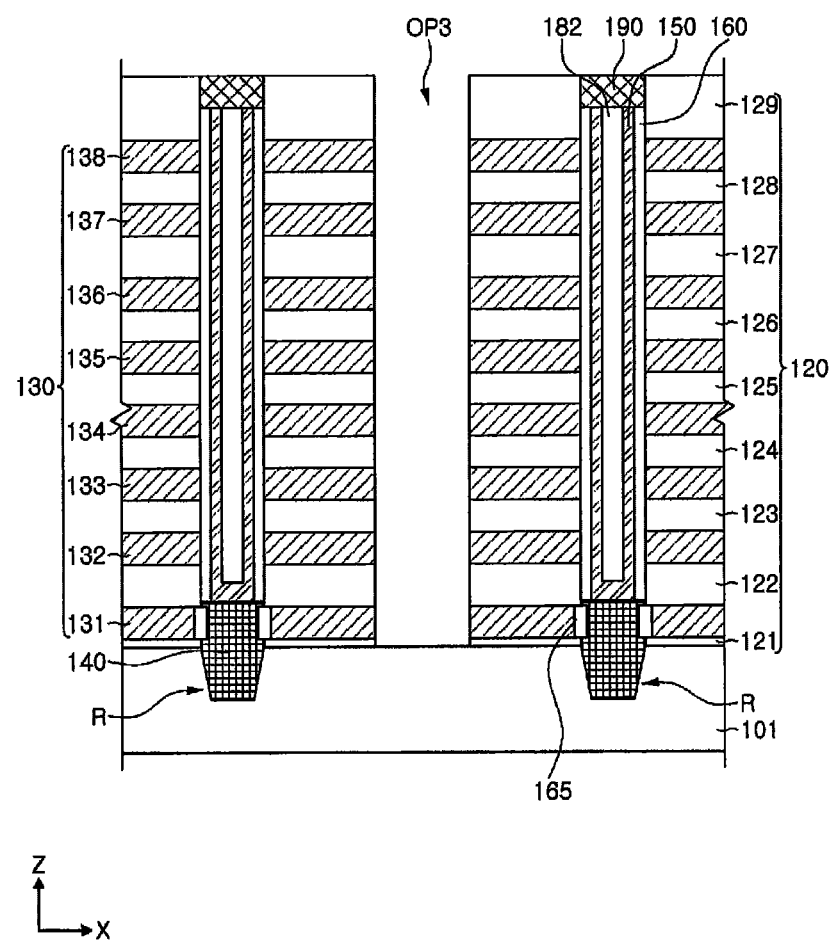

Referring to FIG. 13, gate electrodes 130 may be formed within the lateral openings LP.

The gate electrodes 130 may include a metal. In some embodiments, the gate electrodes 130 may include, for example, tungsten (W), aluminum (Al), copper (Cu), and the like. According to some embodiments, the gate electrodes 130 may include a diffusion barrier (not shown). First, a diffusion barrier may be formed to uniformly cover the interlayer insulating layers 120, the gate dielectric layer 160, the epitaxial insulating layers 165, and the upper surface of the substrate 101 exposed by the second opening OP2 and the lateral openings LP. Next, the lateral openings LP may be enclosed by a metal.

Thereafter, in order to allow only the gate electrodes 130 to be disposed within the lateral openings LP, a material forming the gate electrodes 130 formed within the second opening OP2 is removed through an etching process to form a third opening OP3. The third opening OP3 may have a trench shape extending in the y direction (please refer to FIG. 7).

As a result, gate structures including the interlayer insulating layers 120 and the gate electrodes 130 alternately stacked on the substrate 101 may be formed. The gate electrodes 130 may be exposed to lateral surfaces of the third opening OP3 formed between the gate structures. The gate structures may include the channels 150 penetrating the interlayer insulating layers 120 and the gate electrodes 130 in a direction perpendicular to the upper surface of the substrate 101. Also, the gate structures may include the epitaxial layers 140 disposed below the channels 150 on the substrate 101 and gate dielectric layers 160 disposed between the channels 150 and the gate electrodes 130. The gate dielectric layers 160 may each have a structure including a tunneling dielectric layer 162, an electric charge storage layer 164, and a blocking dielectric layer 166 sequentially disposed on the channels 150.

Figure 14:
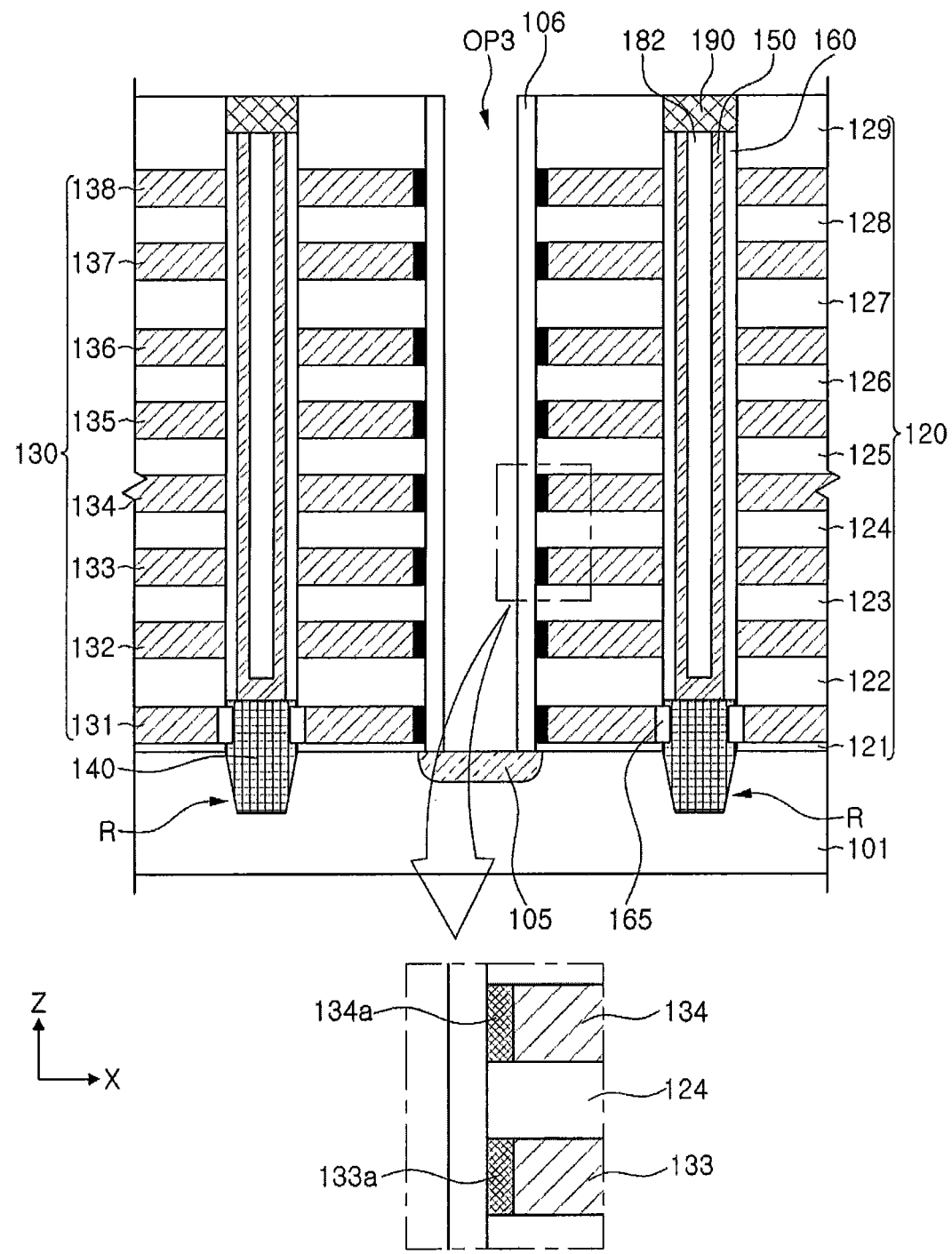
Figure 15:
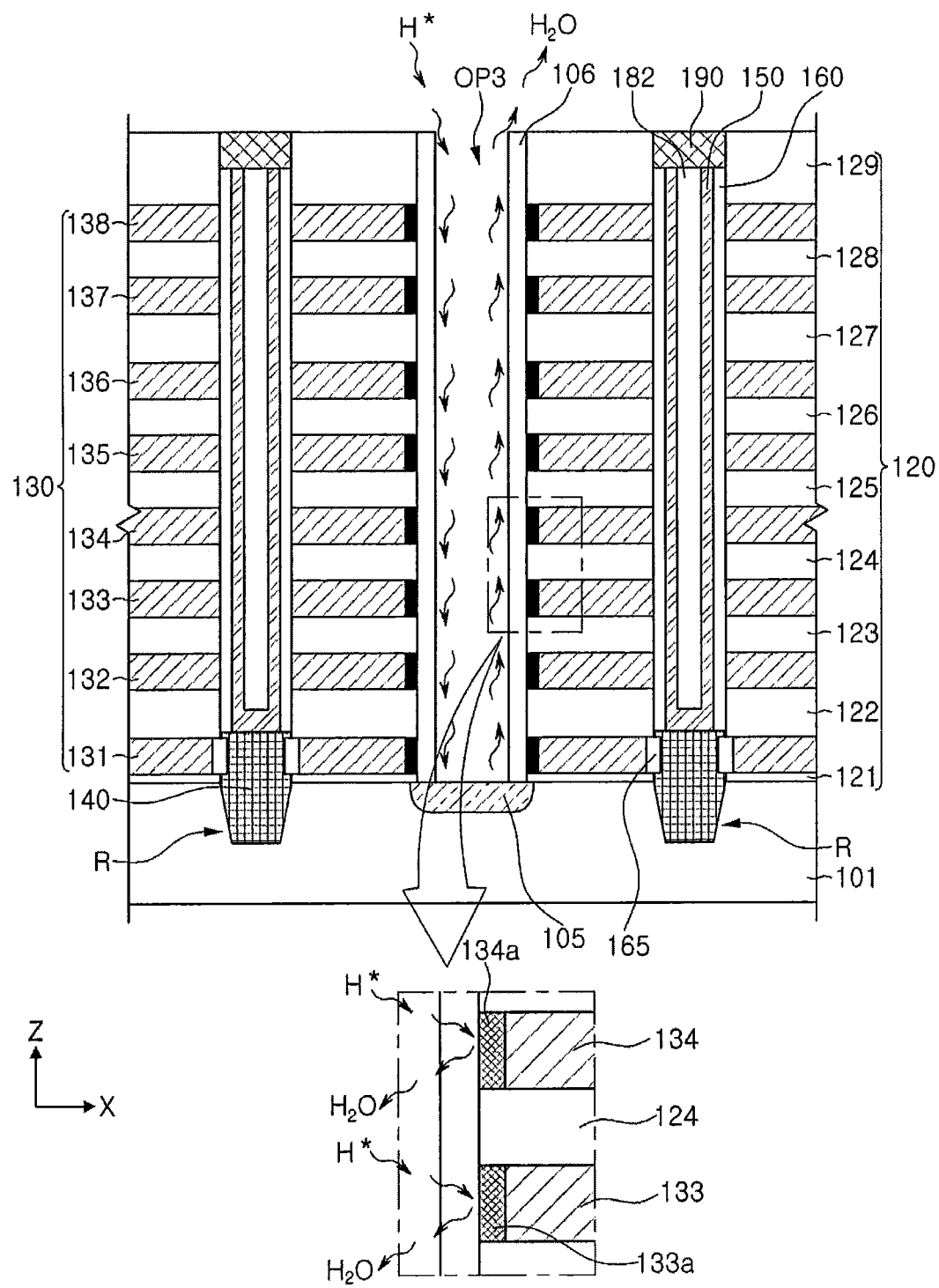

Referring to FIG. 14, a source region 105 is formed on the substrate 101 exposed by the third opening OP3 between the gate structures, and a second insulating layer 106 covering lateral surfaces of the third opening OP3 may be formed.

First, the source region 105 may be formed by ion-implanting an impurity in the substrate 101 exposed by the third opening OP3 using the gate structures as a mask. In some embodiments, the source region 105 may be formed after the second insulating layer 106 is formed. the source region 105 may be formed to include a high concentration region and low concentration doped regions disposed on both ends of the high concentration region.

Next, the second insulating layer 160 may be formed to cover the gate structures at a uniform thickness. Namely, the second insulating layer 106 may be formed to cover the interior of the third opening OP3 between the gate structures, to a uniform thickness. The second insulating layer 106 may be any one of, for example, a silicon oxide film, a high temperature oxide (HTO), a high density plasma (HDP) oxide, a tetraethylorthosilicate (TEOS), a borophosphosilicate glass (BPSG), or undoped silicate glass (USG). The second insulating layer 106 may be formed using an ALD process, a CVD process, or the like. During the process of forming the second insulating layer 106, oxide layers may be formed on the surfaces of the gate electrodes in contact with the second insulating layer 106. An enlarged view in a lower portion of FIG. 14 illustrates oxidized surface layers 133a and 134a of partial gate electrodes.

The formation of the oxidized surface layers may increase a sheet resistance value of the gate electrodes, and the increase in the sheet resistance value may increase an RC delay to result in a degradation of performance of the semiconductor device.

Thereafter, a portion of the second insulating layer 106 is removed by using an anisotropic etching process to expose a portion of the source region 105. As a result, the second insulating layer 106 covering the lateral surfaces of the gate structures, namely, the lateral surface of the third opening OP3, may be formed. As the anisotropic etching process, a reactive ion etch (RIE) process may be used, for example, Referring to FIG. 15, a heat treatment process using hydrogen radicals (H*) may be performed to reduce the oxidized surface layers of the gate electrodes 130 to metals which constitute the gate electrodes 130.

In detail, the substrate 101, on which the gate structures in which the interlayer insulating layers 120 and the gate electrodes 130 are alternately stacked and the second insulating layer 106 covering the lateral surfaces of the gate structures as described above with reference to FIG. 14 are formed, is installed within a heat treatment chamber (Si of FIG. 1), and pressure and a temperature within the heat treatment chamber may subsequently be adjusted to predetermined pressure and temperature. The pressure may be varied within a range from 1 torr to 20 torr and the temperature may be varied within a range from 400° C. to 700° C. For example, pressure and temperature within the heat treatment chamber may range from about 5.0 torr to 8.0 torr and about 550° C. to 650° C., respectively. In order to adjust pressure within the heat treatment chamber, inert gases may be supplied. The inert gases may be, for example, an argon (Ar) gas, a nitrogen ($N_2$) gas, or any combination thereof.

Hydrogen radicals (H*) having strong reducing power may be generated by supplying gaseous hydrogen and gaseous oxygen to the interior of the heat treatment chamber adjusted to have the predetermined pressure and temperature (S2 in FIG. 1). According to circumstances, the gaseous hydrogen and the gaseous oxygen may simultaneously be supplied, or the hydrogen gas may first be supplied and the oxygen gas may be subsequently supplied. A flow ratio between the gaseous hydrogen and the gaseous oxygen supplied to the interior of the heat treatment chamber may appropriately be adjusted according to pressure and temperature within the heat treatment chamber. For example, a flow ratio between the gaseous hydrogen and the gaseous oxygen supplied to the interior of the heat treatment chamber in which the pressure and temperature have been adjusted to range from about 5.0 torr to 8.0 torr and about 550° C. to 650° C. , respectively, may be 2:3. Specifically, gaseous hydrogen equal to about 400 sccm and gaseous oxygen equal to about 600 sccm may be supplied to the interior of the heat treatment chamber.

The generated hydrogen radical (H*) may be introduced to the interior of the third opening OP3 and reacted with oxygen of the oxidized surface layers of the gate electrodes 130 so as to be converted into water vapor ($H_2O$) and discharged to the outside of the heat treatment chamber, and accordingly, the oxidized surface layers of the gate electrodes 130 may be reduced to metals which constitute the gate electrodes 130 (S3 of FIG. 1).

Unlike the case described above, immediately after the second insulating layer 106 is formed to cover the gate structures, with a uniform thickness, a heat treatment process using hydrogen radical may be performed. Thereafter, an anisotropic etching process to expose a portion of the source region 105 may be performed.

Figure 16:
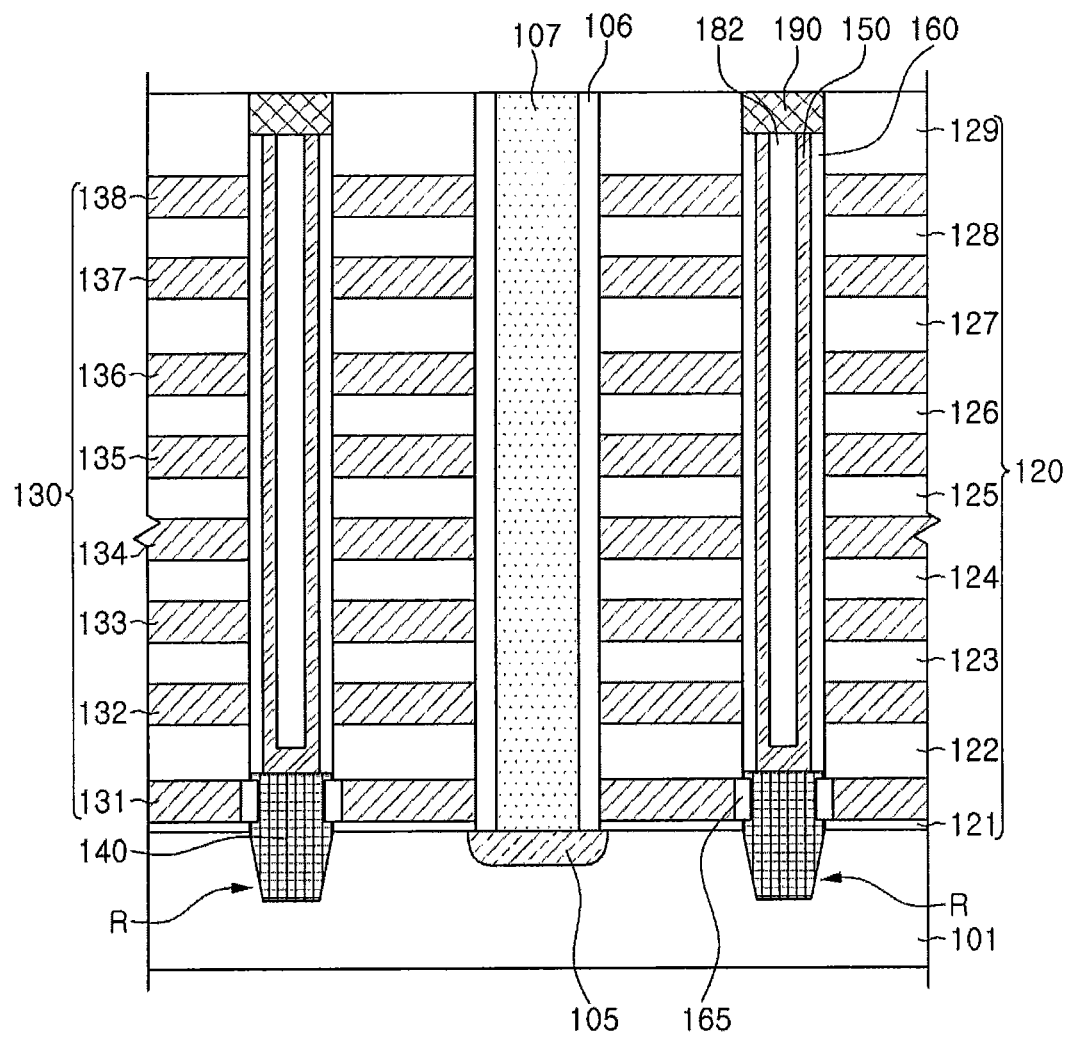

Referring to FIG. 16, after the oxidized surface layers of the gate electrodes 130 are reduced to metals which constitute gate electrodes 130, a common source line 107 electrically insulated from the plurality of gate electrodes 103 by the second insulating layer 106 may be formed on the exposed source region 105.

The process of forming the common source line 107 may include a process of filling the third openings OP3, in which the second insulating layer 106 is formed on the lateral surfaces thereof, with a material having conductivity and a process of performing a chemical mechanical polishing process to expose upper surfaces of the uppermost interlayer insulating layer 129 and the drain pads 190.

The material having conductivity may include, for example, a metal, a metal nitride, and a metal silicide. In some embodiments, the common source line 107 may include tungsten (W).

Thereafter, although not shown, an insulating layer covering the common source line 107, the drain pads 190, and the uppermost interlayer insulating layer 129 may be formed. A conductive contact plug may be formed within the insulating layer such that the conductive contact plug is in contact with the drain pads 190. Bit lines BL may be formed on the insulating layer. The drain pads 190 may be electrically connected to the bit lines BL formed on the insulating layer through the conductive contact plug.

Figure 17:
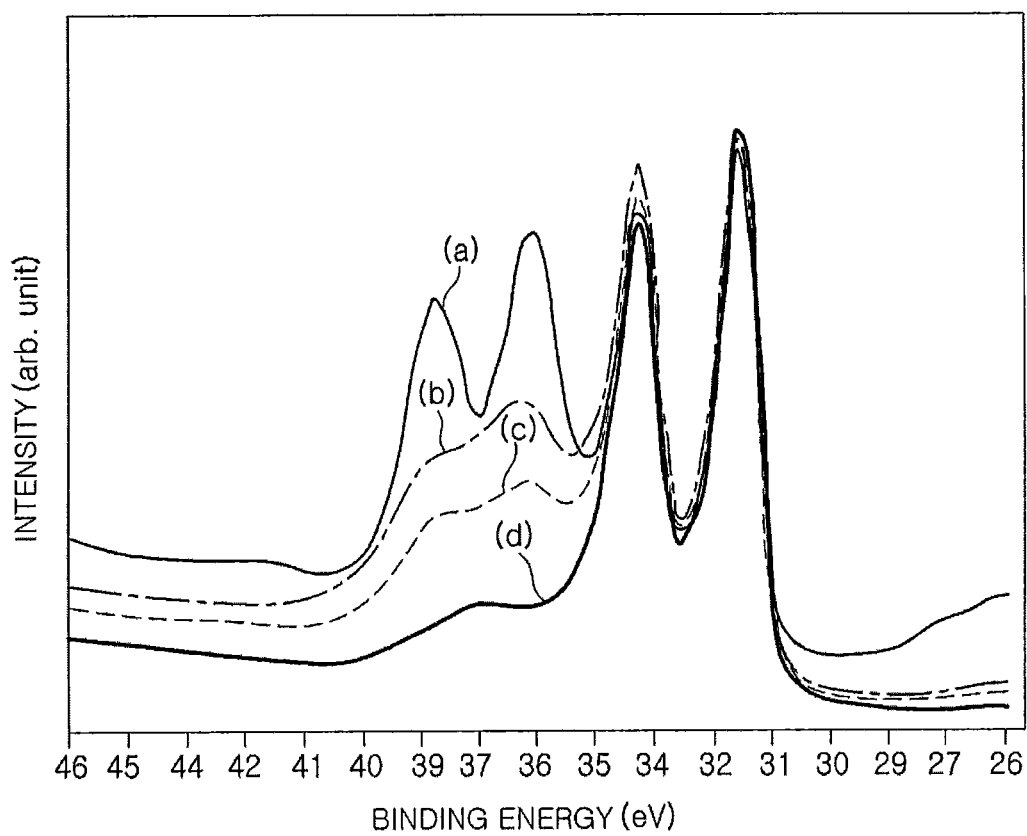
FIG. 17 is a graph illustrating XPS analysis results of a reduction of a tungsten oxide layer over a heat treatment time according to some embodiments of the present inventive concept.

FIG. 17 is a graph illustrating XPS analysis results of a reduction of a tungsten oxide layer over a heat treatment time according to some embodiments of the present inventive concept. In FIG. 17, the curve (a) is XPS analysis data after forming an oxide film having a thickness of 300 Å on a surface of tungsten (W), and the curve (b) is XPS analysis data after heat-treating the tungsten with the oxide film having the thickness 300 Å formed thereon for 30 seconds at pressure equal to 6.7 torr and at a temperature equal to 600° C. using hydrogen radicals. The curve (c) is XPS analysis data after heat-treating the tungsten with the oxide film having the thickness 300 Å formed thereon for 60 seconds at pressure equal to 6.7 torr and at a temperature equal to 600° C. using hydrogen radicals, and the curve (d) is XPS analysis data after heat-treating the tungsten with the oxide film having the thickness 300 A formed thereon for 5 minutes at pressure equal to 6.7 torr and at a temperature equal to 600° C. using hydrogen radicals.

Referring to FIG. 17, it can be seen from the curve (a) that, after the oxide film is formed on the upper surface of tungsten, a tungsten oxide was formed. Namely, in the curve (a), peaks having binding energy of about 36 eV and about 38 eV, originated from the tungsten oxide ($WO_3$), were clearly observed. In the curve (b), it can be seen that, as a heat treatment time was increased at pressure in 6.7 torr and at a temperature of 600° C. from the curve (d), the tungsten oxide ($WO_3$) was gradually reduced to tungsten (W). Namely, it was observed that, as the heat treatment time is increased from 30 seconds to 5 minutes, the peaks having the binding energy of about 36 eV and about 38 eV were gradually weakened. In the case of heat treatment for five minutes at 6.7 torr and at 600° C. (the curve (d)), only peaks having binding energy of about 31.5 eV and about 34 eV, originated from tungsten (W) were observed.

Meanwhile, it was observed that, as the tungsten oxide ($WO_3$) formed on the surface was reduced to tungsten (W), sheet resistance of the gate electrode including tungsten (W) was decreased from about 16 ohm/sqr. To about 12 ohm/sqr. Thus, since the sheet resistance of the gate electrode is reduced, RC delay characteristics may be enhanced.

Figure 18:
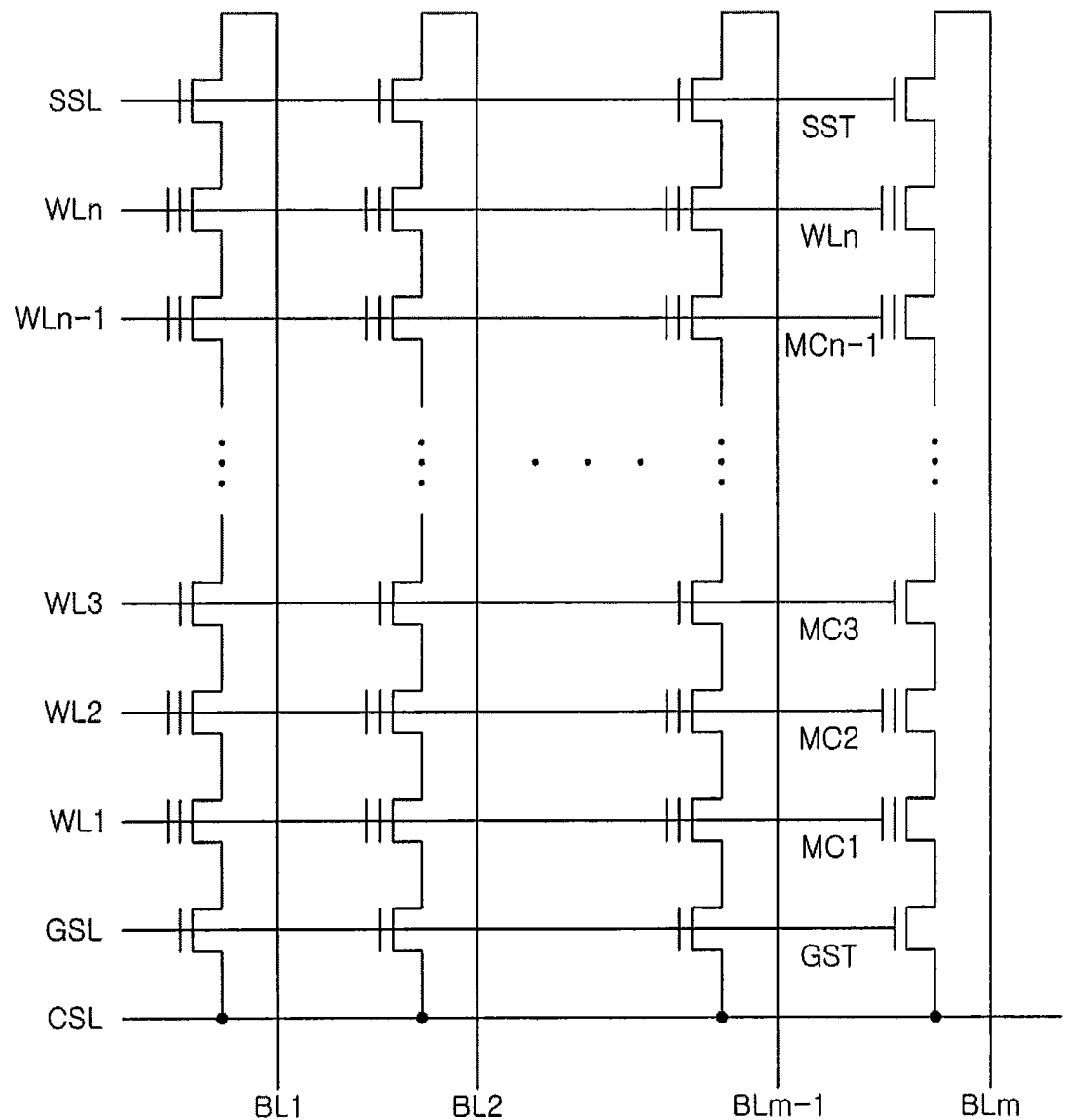
FIG. 18 is an equivalent circuit diagram of a memory cell array of a semiconductor device according to some embodiments of the present inventive concept.

FIG. 18 is an equivalent circuit diagram of a memory cell array of a semiconductor device according to some embodiments of the present inventive concept. A semiconductor device according to some embodiments of the present inventive concept may be a planar-type non-volatile memory device.

Referring to FIG. 18, a memory cell array may include memory cell blocks, and each of the memory cell blocks may include pages. Each of the pages may include memory cell elements MC1 to MCn connected to a single word line. Meanwhile, each of the memory cell blocks may include memory cell strings. Each of the memory cell strings may include a string select transistor SST connected to a string select line SSL, memory cell elements MC1 to MCn connected to word lines WL1 to WLn, and a ground select transistor GST connected to a ground select line GSL. The string select transistor SST may be connected to a bit line BL, and the ground select transistor GST may be connected to a common source line CSL. The memory cell elements MC1 to MCn may be connected in series between a single bit line BL and the common source line CSL.

Figure 19:
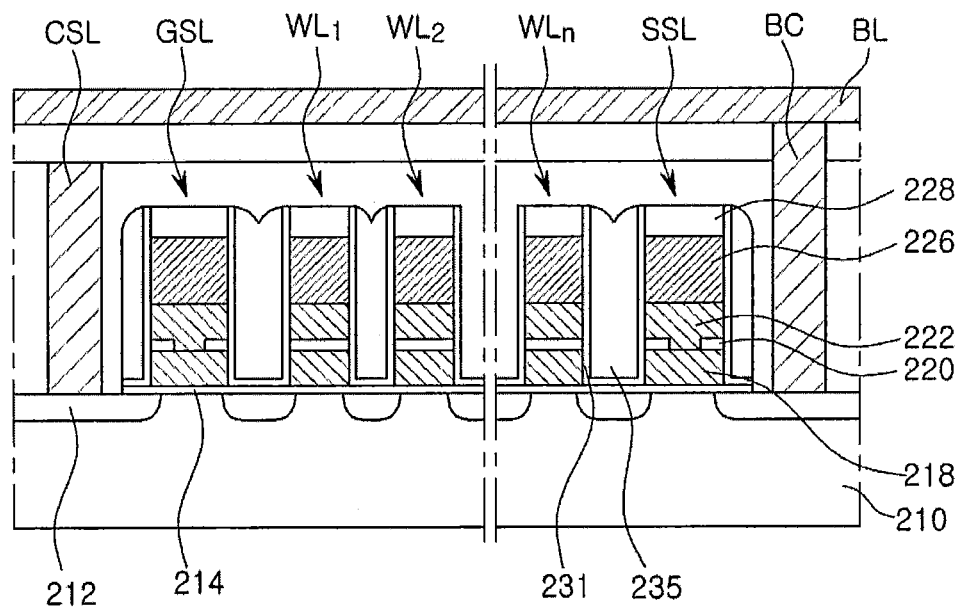
FIG. 19 is a cross-sectional view schematically illustrating a single memory cell string of a semiconductor device according to some embodiments of the present inventive concept.

FIG. 19 is a cross-sectional view schematically illustrating a single memory cell string of a semiconductor device according to some embodiments of the present inventive concept.

Referring to FIG. 19, a semiconductor device 200B may include a string select transistor connected to a bit line BL through a bit line contact BC, a ground select transistor connected to a common source line CSL, and memory cells disposed between the string select transistor and the ground select transistor. Gate electrodes of the memory cells may extend abreast in one direction to form word lines WL1 to WLn. Gate electrodes of the ground select transistor and the string select transistor may extend in a direction parallel to the word lines WL1 to WLn to form a ground select line GSL and a string select line SSL, respectively.

Each of the memory cells may include a first-type gate structure including a tunneling dielectric layer 214, an electric charge storage layer 218, a blocking dielectric layer 220, and a gate electrode, formed on a substrate 210. The gate electrode may include a first conductive layer 222 and a second conductive layer 226. The electric charge storage layer 218 may be provided as an electric charge trap layer or a floating gate conductive layer.

The string select transistor connected to the string select line SSL and the ground select transistor GST connected to the ground select line GSL may each include a second-type gate structure including a tunneling dielectric layer 214, an electric charge storage layer 218, a blocking dielectric layer 220 in which a partial region has been removed, and the gate electrode, formed on the substrate 210. As a partial region of the blocking dielectric layer 220 is removed, the gate electrode and the electric charge storage layer 218 may be electrically connected.

The first conductive layer 222 may be a polycrystalline silicon layer doped to have a high concentration, and the second conductive layer 226 may be a metal layer. In some embodiments, the metal layer may include tungsten (W), aluminum (Al), copper (Cu), and the like. A buffer oxide film 231 and a spacer 235 may be disposed on the sides of the gate electrodes. A region 212 doped with an impurity may be disposed in the substrate between the gate structures. The region 212 doped with an impurity may also be disposed on the substrate in which the bit line contact BC and the common source line CSL are formed.

FIGS. 20 through 25 are cross-sectional views illustrating major processes of a method for manufacturing a semiconductor device according to some embodiments of the present inventive concept.

Figure 20:
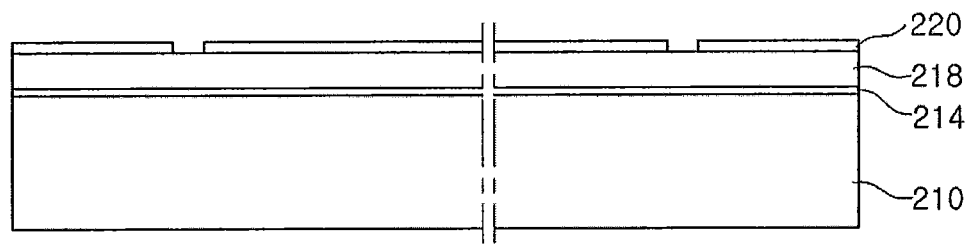
FIGS. 20 through 25 are cross-sectional views illustrating major processes of a method for manufacturing a semiconductor device according to some embodiments of the present inventive concept.

Referring to FIG. 20, a tunneling dielectric layer 214, an electric charge storage layer 218, and a blocking dielectric layer 220 may be sequentially formed on the substrate 210. Thereafter, a partial region of the blocking dielectric layer 220 may be removed in order to allow a first conductive layer 222 formed on the blocking dielectric layer 220 to be electrically connected to the electric charge storage layer 218. The electric charge storage layer 218 may be provided as an electric charge trap layer or a floating gate conductive layer according to some embodiments. In some embodiments, the electric charge storage layer 218 may be provided as a floating gate conductive layer and may be formed as a polycrystalline silicon layer in which an n-type impurity such as phosphor (P), arsenic (As), and the like, is doped with a high concentration.

Figure 21:
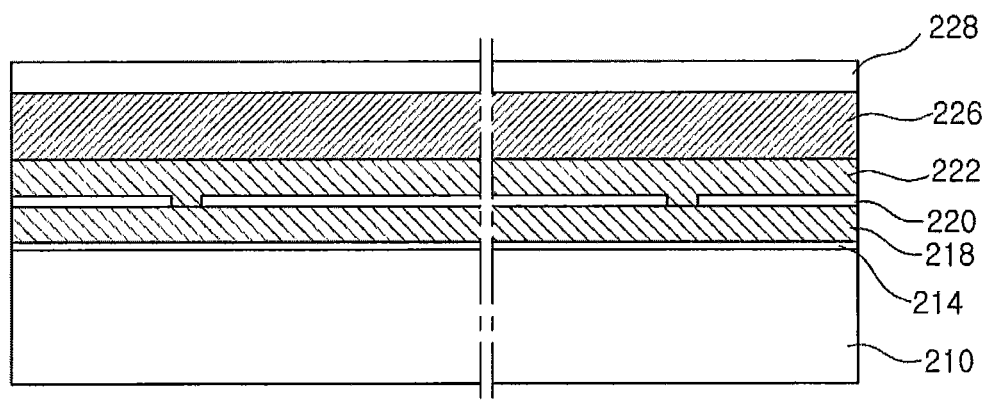

Referring to FIG. 21, the first conductive layer 222, a second conductive layer 226, and a hard mask layer 228 may sequentially be formed on the blocking dielectric layer 220. The first conductive layer 222 may be a polycrystalline silicon layer in which an n-type impurity such as phosphor (P), arsenic (As), and the like, is doped with a high concentration, and the second conductive layer 226 may be a metal layer such as tungsten (W), aluminum (Al), copper (Cu), and the like. The second conductive layer 26 may include a diffusion barrier. In some embodiments, the second conductive layer 226 may include tungsten (W).

Figure 22:
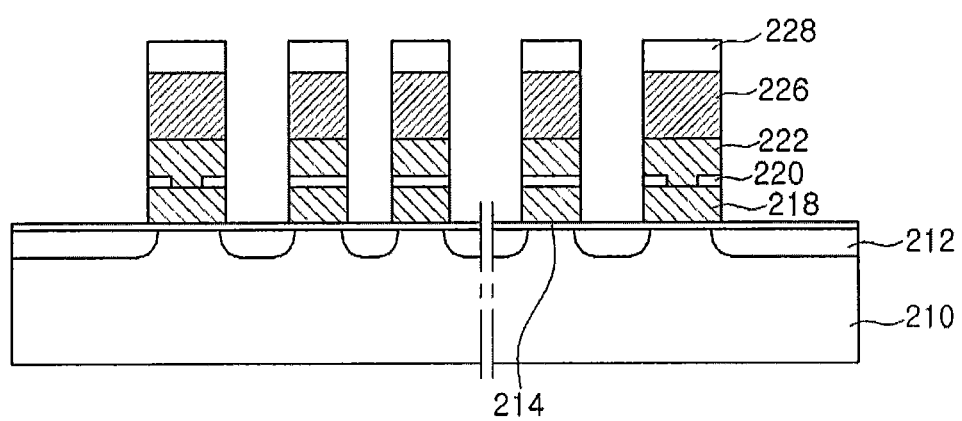

Referring to FIG. 22, the hard mask layer 228 is patterned through a photolithography process, and thereafter, the second conductive layer 226, the first conductive layer 222, the blocking dielectric layer 220, and the electric charge storage layer 228 may be sequentially anisotropically etched using the patterned hard mask layer 228 as an etching mask to form gate structures. Here, the tunneling dielectric layer 214 may serve as an etch stop layer, and may serve as a buffer layer during a follow-up ion implantation process. Impurity regions 212 may be formed in the substrate 210 between the gate structures. The impurity regions 212 may be formed by performing ion implantation process using the gate structures as masks.

Figure 23:
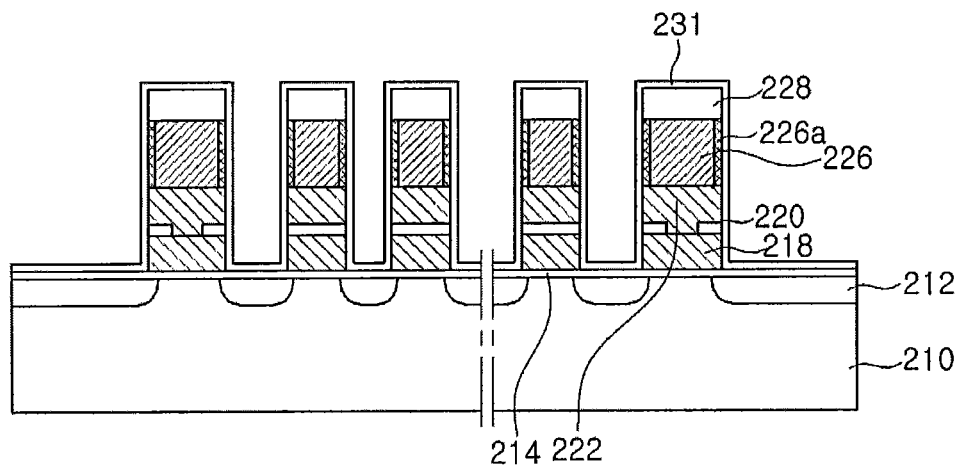

Referring to FIG. 23, a buffer oxide film 231 may be formed to cover the gate structures. The buffer oxide film 231 may also be formed on the substrate between the gate structures. The buffer oxide film 231 may be any one among, for example, a silicon oxide film, a high temperature oxide (HTO), a high density plasma (HDP) oxide, a tetraethylorthosilicate (TEOS), a borophosphosilicate glass (BPSG), or an undoped silicate glass (USG). During the process of forming the buffer oxide film 231, oxide layers 226a may be formed on surfaces of the second conductive layer 226. In some embodiments, the oxide layers 226a formed on the surfaces of the second conductive layer 226 may be a tungsten oxide ($WO_3$).

Alternatively, the etching process performed to form the gate electrodes may cause etch damage to the tunneling dielectric layer 214, the electric charge storage layer 218, the first conductive layer 222, and the second conductive layer 226 included in the gate structures. Thus, when reoxidation process is performed to cure the etch damage, a portion of the oxide layers 226a may be formed on the surface of the second conductive layer 226. Thereafter, the remaining portion of the oxide layers 226 may be formed on the surfaces of the second conductive layer 226 during a process of forming a buffer oxide film 281.

The first conductive layer 222 and the second conductive layer 226 included in the gate structures may be provided as a gate electrode. The formation of the oxidized surface layer may increase a sheet resistance value of the gate electrode and the increase in the sheet resistance value may increase RC delay, degrading performance of the semiconductor device. In some embodiments, the first conductive layer 22 may be a polycrystalline silicon layer doped with an n-type impurity in a high concentration, and the second conductive layer 226 may be a metal layer including tungsten (W). When the second conductive layer 226 having a lower resistance value is oxidized, the sheet resistance value of the gate electrode may further increase. Also, tungsten oxide ($WO_3$) having conductivity may be grown as a needle-like whisker to short-circuit neighboring gate electrodes. Thus, a process of reducing the oxidized surface layers 226a of the second conductive layer 226 needs to be performed.

Figure 24:
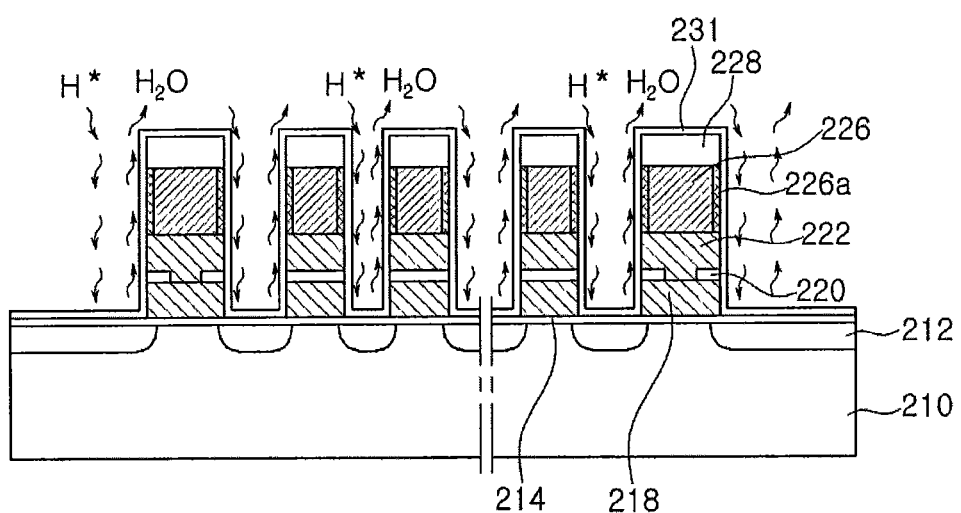

Referring to FIG. 24, a heat treatment process using hydrogen radicals (H*) may be performed to reduce the oxidized surface layers 226a of the second conductive layers 226 to metal which constitute the second conductive layers 226.

In detail, after the process of forming the buffer oxide film 231 described above with reference to FIG. 23 is completed, the substrate 101, on which the buffer oxide film 231 covering the gate structures is formed, may be installed within a heat treatment chamber (Si of FIG. 1) and the interior of the heat treatment chamber may subsequently be adjusted to predetermined pressure and temperature. The pressure may be varied within a range from about 1 torr to about 20 torr and the temperature may be varied within the range from about 400° C. to about 700° C. For example, pressure and temperature within the heat treatment chamber may range from about 5.0 torr to about 8.0 torr and about 550° C. to 650° C., respectively. In order to adjust pressure within the heat treatment chamber, inert gases may be supplied. The inert gases may be, for example, an argon (Ar) gas or a nitrogen ($N_2$) gas.

Hydrogen radicals (H*) having strong reducing power may be generated by supplying gaseous hydrogen and gaseous oxygen to the interior of the heat treatment chamber adjusted to have the predetermined pressure and temperature (S2 in FIG. 1). According to circumstances, the gaseous hydrogen and the gaseous oxygen may simultaneously be supplied, or the hydrogen gas may first be supplied and the oxygen gas may subsequently be supplied. A flow ratio between the gaseous hydrogen and the gaseous oxygen supplied to the interior of the heat treatment chamber may appropriately be adjusted according to pressure and temperature within the heat treatment chamber. For example, a flow ratio between the gaseous hydrogen and the gaseous oxygen supplied to the interior of the heat treatment chamber in which the pressure and temperature have been adjusted to range from about 5.0 torr to about 8.0 torr and about 550° C. to about 650° C., respectively, may be 2:3. Specifically, gaseous hydrogen equal to about 400 sccm and gaseous oxygen equal to about 600 sccm may be supplied to the interior of the heat treatment chamber.

The generated hydrogen radical (H*) may be introduced between the gate structures and reacted with oxygen of the oxidized surface layers 226a of the second conductive layers 226 so as to be converted into vapor ($H_2O$) and discharged to the outside of the heat treatment chamber, and accordingly, the oxidized surface layers 226a of the second conductive layers 226 may be reduced to metal which constitute the second conductive layers 226 (S3 of FIG. 1).

In some embodiments, the second conductive layer 226 may be tungsten (W), and the oxidized surface layers 226a of the second conductive layer 226 may be a tungsten oxide ($WO_3$). For example, by performing a heat treatment using hydrogen radials within a heat treatment chamber in which a pressure and a temperature are adjusted to about 5.0 torr to 8.0 torr and about 550° C. to 650° C., the tungsten oxide ($WO_3$) may be reduced to tungsten (W).

Figure 25:
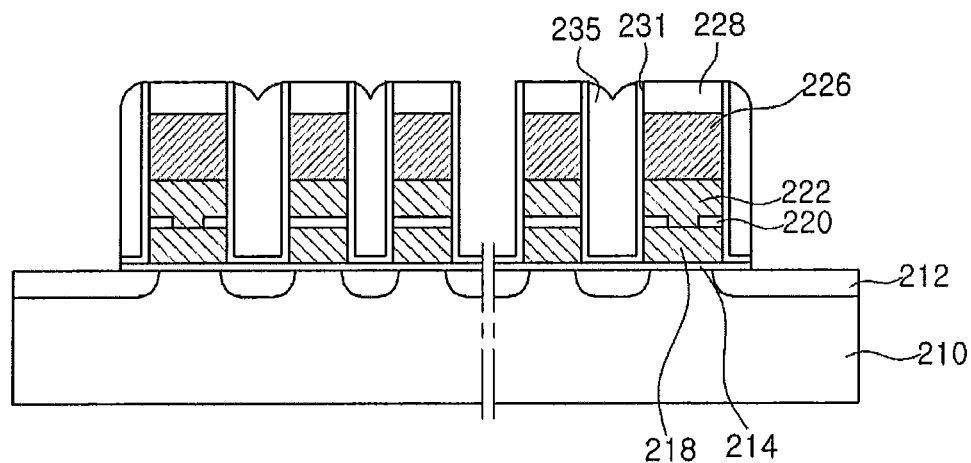

Referring to FIG. 25, spacers 235 may be formed on lateral surfaces of the gate structures. In detail, a space insulating layer may be formed on the buffer oxide film 231 and an anisotropic etching process may subsequently be performed to form the spacers 235. The spacer insulating layer may be formed of a material having etch selectivity with respect to the buffer oxide film 231. For example, the buffer oxide film 231 may be a silicon oxide and the spacer insulating layer may be a silicon nitride.

Thereafter, although not shown, a process of forming a common source line CSL and a process of forming a bit line contact BC and a bit line BL may be further performed to complete electrically connected memory cell strings.

Figure 26:
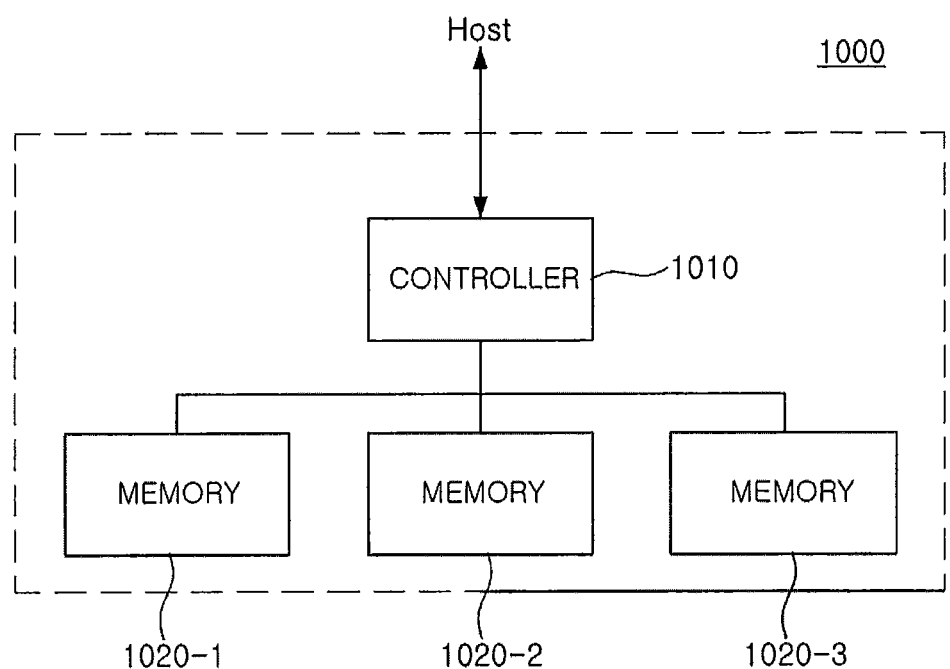
FIG. 26 is a block diagram illustrating a storage device including a semiconductor device according to some embodiments of the present inventive concept.

FIG. 26 is a block diagram illustrating a storage device including a semiconductor device according to some embodiments of the present inventive concept.

Referring to FIG. 26, a storage device 1000 may include a controller 1010 communicating with a host HOST and memories 1020-1, 1020-2, and 1020-3 storing data. Each of the memories 1020-1, 1020-2, and 1020-3 may include the semiconductor devices according to various embodiments of the present inventive concept as described above.

The host HOST communicating with the controller 1010 may be various electronic devices in which the storage device 100 is installed. For example, the host HOST may be a smartphone, a digital camera, a desktop computer, a laptop computer, a media player, or the like. When a data write or read request is received from the host HOST, the controller 1010 may generate a command CMD for storing data in the memories 1020-1, 1020-2, and 1020-3 or retrieving data from the memories 1020-1, 1020-2, and 1020-3.

As illustrated in FIG. 26, one or more memories 1020-1, 1020-2, and 1020-3 may be connected to the controller 1010 in parallel within the storage device 1000. By connecting the plurality of memories 1020-1, 1020-2, and 1020-3 to the controller 1010 in parallel, the storage device 1000 having large capacity, such as a solid state drive (SSD), may be implemented.

Figure 27:
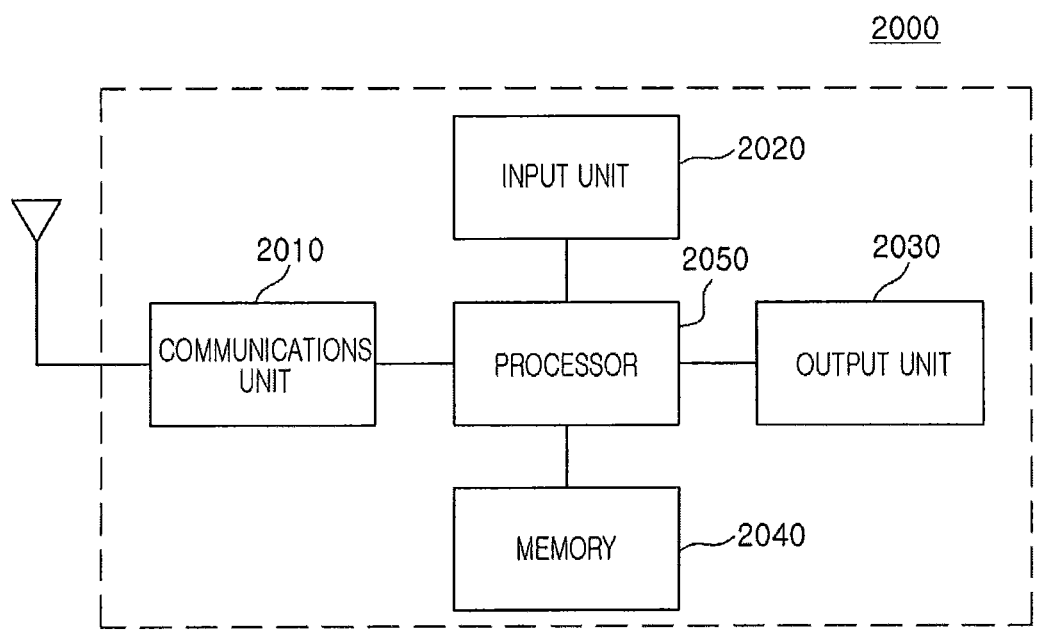
FIG. 27 is a block diagram illustrating an electronic device including a semiconductor device according to some embodiments of the present inventive concept.

FIG. 27 is a block diagram illustrating an electronic device including a semiconductor device according to some embodiments of the present inventive concept.

Referring to FIG. 27, an electronic device 2000 according to some embodiments may include a communications unit 2010, an input unit 2020, an output unit 2030, a memory 2040, and a processor 2050.

The communications unit 2010 may include a wired/wireless communications module, and may include a wireless Internet module, a short-range communications module, a global positioning system (GPS) module, a mobile communications module, and the like. A wired/wireless communications module included in the communications unit 2010 may be connected to an external communication network based on various communication standards to transmit and receive data.

The input unit 2010, provided to allow a user to control an operation of the electronic device 2000, may include a mechanical switch, a touchscreen, a voice recognition module, and the like. Also, the input unit 2010 may include a mouse or a finger mouse device operating in a track ball or a laser pointer manner, or the like. In addition, the input unit 2020 may further include various sensor modules allowing the user to input data.

The output unit 2030 outputs information processed by the electronic device 2000 in an audio or video format, and the memory 2040 may store a program for processing and controlling the processor 2050, data, or the like. The memory 2040 may include one or more semiconductor devices according to various embodiments of the present inventive concept as described above. The processor 2050 may deliver a command to the memory 2040 according to a necessary operation in order to store data to the memory 2040 or retrieve data therefrom.

The memory 2040 may be installed in the electronic device 2000 or communicate with the processor 2050 through a separate interface. In a case in which the memory 240 communicates with the processor 2050 through a separate interface, the processor 2050 may store data to the memory 2040 or retrieve data therefrom through various interface standards such as SD, SDHC, SDXC, MICRO SD, USB, or the like.

The processor 2050 controls operations of the components included in the electronic device 2000. The processor 2050 may perform controlling and processing related to an audio call, a video call, data communication, and the like, or may perform controlling and processing for multimedia playback and management. Also, the processor 2050 may process an input delivered from the user through the input unit 2020 and output corresponding results through the output unit 2030. Further, as described above, the processor 2050 may store data required for controlling an operation of the electronic device 2000 to the memory 2040 or retrieve such data therefrom.

Figure 28:
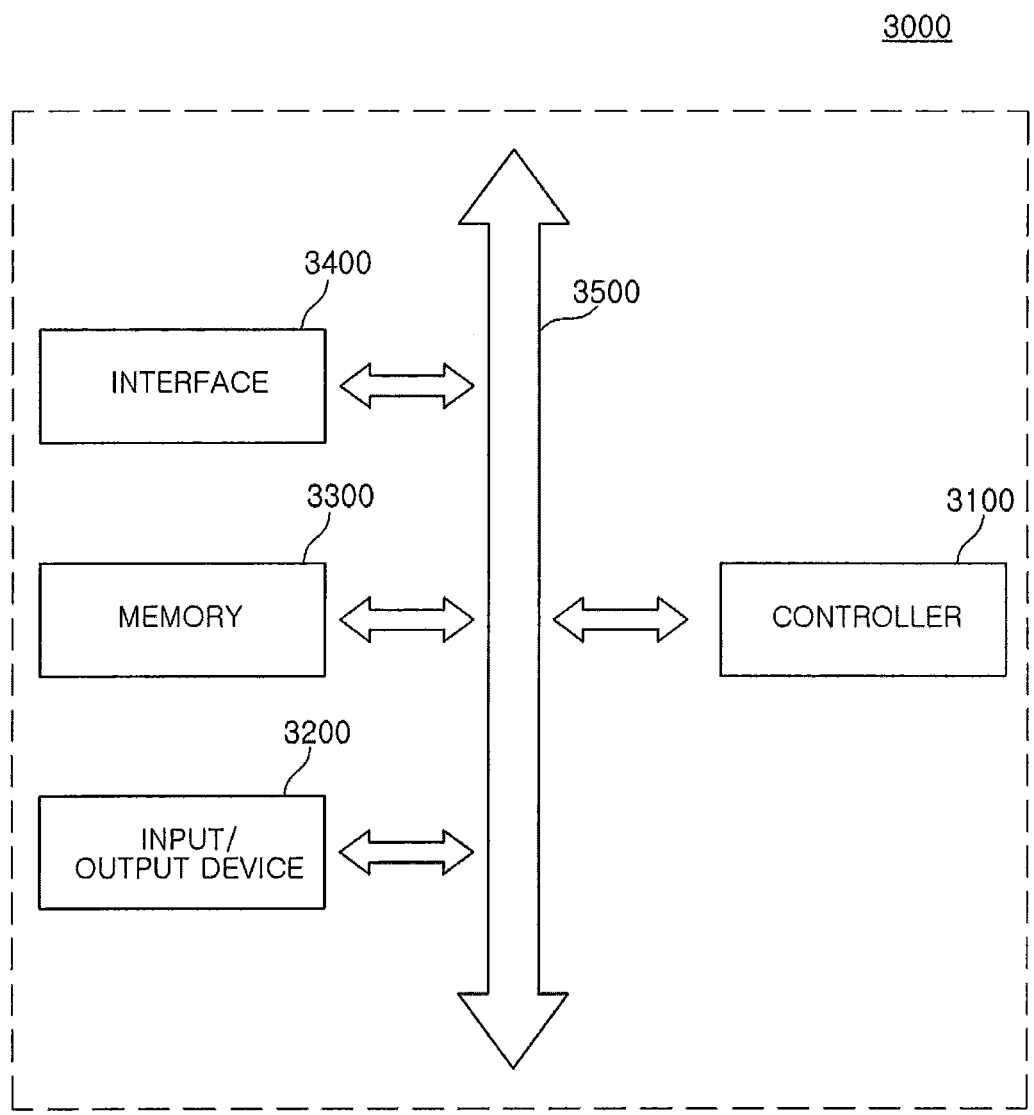
FIG. 28 is a block diagram illustrating an electronic system including a semiconductor device according to some embodiments of the present inventive concept.

FIG. 28 is a block diagram illustrating an electronic system including a semiconductor device according to some embodiments of the present inventive concept.

Referring to FIG. 28, an electronic system 3000 may include a controller 3100, an input/output device 3200, a memory 3300, and an interface 3400. The electronic system 3000 may be a mobile system or a system transmitting or receiving information. The mobile system may be a portable digital assistant (PDA), a portable computer, a tablet PC, a wireless phone, a mobile phone, a digital music player, or a memory card.

The controller 3100 may serve to execute a program and to control the electronic system 3000. The controller 3100 may be, for example, a microprocessor, a digital signal processor, or a microcontroller, or any device similar thereto.

The input/output device 3200 may be used to input or output data of the electronic system 3000. The electronic system 3000 may be connected to an external device, for example, a personal computer or a network and exchange data therewith by using the input/output device 3200. The input/output device 3200 may be, for example, a keypad, a keyboard, or a display.

The memory 3300 may store codes and/or data for an operation of the controller 3100, and/or store data processed by the controller 3100. The memory 3300 may include the semiconductor device according to some embodiments of the present inventive concept.

The interface 3400 may be a data transmission passage between the electronic system 3000 and an external device. The controller 3100, the input/output device 3200, the memory 3300, and the interface 3400 may communicate through a bus 3500.

At least one of the controller 3100 and the memory 3300 may include one or more semiconductor devices as described above.

As set forth above, according to some embodiments of the present inventive concept, by reducing the oxidized surface layer of the metal layer used as a gate electrode of a semiconductor device to a metal through a heat treatment using hydrogen radicals, sheet resistance of the gate electrode may be reduced.

While some embodiments have been shown and described above, it will be apparent to those skilled in the art that modifications and variations could be made without departing from the scope of the present invention as defined by the appended claims. The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method for manufacturing a semiconductor device, the method comprising:
   providing a substrate including a metal layer comprising an oxidized surface layer and an oxide layer in a heat treatment chamber, the metal layer and the oxide layer being sequentially stacked on the substrate;

generating hydrogen radicals within the heat treatment chamber; and reducing the oxidized surface layer of the metal layer that underlies the oxide layer using the hydrogen radicals.

2. The method of claim 1, wherein generating the hydrogen radicals comprises supplying gaseous hydrogen and gaseous oxygen to the heat treatment chamber.

3. The method of claim 2, wherein the gaseous hydrogen and the gaseous oxygen are supplied in a flow ratio of about 2:3.

4. The method of claim 1, wherein a temperature of an interior of the heat treatment chamber ranges from about 400° C. to about 700° C., and
wherein a pressure of the interior of the heat treatment chamber ranges from about 1 torr to about 20 torr.

5. The method of claim 1, wherein the metal layer includes tungsten.

6. A method for manufacturing a semiconductor device, the method comprising:
forming gate structures, each of which includes at least one gate electrode comprising an oxidized surface layer, on a substrate;
forming an oxide film on the gate structures; and
heat treating the gate structures,
wherein heat treating the gate structures comprises:
providing the substrate including the gate electrodes each comprising the oxidized surface layer in a heat treatment chamber;
generating hydrogen radicals within the heat treatment chamber; and
reducing the oxidized surface layers of the gate electrodes that underlie the oxide film using the hydrogen radicals.

7. The method of claim 6, wherein each of the gate structures further includes a tunneling dielectric layer, an electric charge storage layer, and a blocking dielectric layer sequentially stacked on the substrate, and each of the gate electrodes includes a metal layer.

8. The method of claim 7, wherein the oxidized surface layers of the gate electrodes include metal oxide, and
wherein reducing the oxidized surface layers of the gate electrodes comprises reducing the metal oxide to metal.

9. The method of claim 6, wherein generating the hydrogen radicals comprises supplying gaseous hydrogen and gaseous oxygen in a flow ratio of about 2:3 to an interior of the heat treatment chamber.

10. The method of claim 6, wherein a temperature of an interior of the heat treatment chamber ranges from about 400° C. to about 700° C.

11. The method of claim 6, wherein a pressure in an interior of the heat treatment chamber ranges from about 1 torr to about 20 torr.

12. A method for manufacturing a semiconductor device, the method comprising:
forming gate structures, each including a plurality of gate electrodes, a plurality of interlayer insulating layers alternately stacked with the plurality of gate electrodes, channels penetrating through the plurality of gate electrodes and the plurality of interlayer insulating layers, and gate dielectric layers disposed between the channels and the gate electrodes, on a substrate;
forming an oxide film to cover the gate structures; and
heat-treating the gate structures,
wherein heat-treating the gate structures comprises:
providing the substrate including the gate electrodes, each of which comprises an oxidized surface layer in a heat treatment chamber;
generating hydrogen radicals within the heat treatment chamber; and
reducing the oxidized surface layers of the gate electrodes using the hydrogen radicals.

13. The method of claim 12, wherein reducing the oxidized surface layers of the gate electrodes comprises reducing a metal oxide to a metal.

14. The method of claim 13, wherein the metal oxide includes tungsten oxide and the metal includes tungsten.

15. The method of claim 12, wherein generating hydrogen radicals comprises supplying gaseous hydrogen and gaseous oxygen in a flow ratio of about 2:3 to an interior of the heat treatment chamber.

16. The method of claim 12, wherein a temperature of an interior of the heat treatment chamber ranges from about 400° C. to about 700° C.

17. The method of claim 12, wherein a pressure in an interior of the heat treatment chamber ranges from about 1 torr to about 20 torr.

18. The method of claim 12, wherein the gate dielectric layers each comprise a tunneling dielectric layer, an electric charge storage layer, and a blocking dielectric layer which are sequentially disposed.

19. The method of claim 1, wherein the oxide layer is free of metal.

20. The method of claim 6, wherein each of the gate electrodes includes a metal layer, and the oxide film is free of metal.

* * * * *